US007994480B2

(12) United States Patent
Johnson et al.

(10) Patent No.: US 7,994,480 B2
(45) Date of Patent: Aug. 9, 2011

(54) VISIBLE LIGHT AND IR COMBINED IMAGE CAMERA

(75) Inventors: Kirk R. Johnson, Rogers, MN (US); Thomas McManus, Plymouth, MN (US); John W. Pratreu, Minnetonka, MN (US)

(73) Assignee: Fluke Corporation, Everett, WA (US)

( * ) Notice: Subject to any disclaimer, the term of this patent is extended or adjusted under 35 U.S.C. 154(b) by 1220 days.

(21) Appl. No.: 11/458,600

(22) Filed: Jul. 19, 2006

(65) Prior Publication Data

US 2006/0249679 A1 Nov. 9, 2006

Related U.S. Application Data

(63) Continuation of application No. 11/294,752, filed on Dec. 5, 2005, now Pat. No. 7,538,326.

(60) Provisional application No. 60/633,078, filed on Dec. 3, 2004.

(51) Int. Cl.
*G01T 1/24* (2006.01)
*H01L 25/00* (2006.01)
*A61B 6/00* (2006.01)

(52) U.S. Cl. ............... 250/370.08; 250/332; 600/476

(58) Field of Classification Search ............ 250/370.08, 250/330, 332, 311, 358.1, 359.1, 339.11, 250/339.12; 600/476
See application file for complete search history.

(56) References Cited

U.S. PATENT DOCUMENTS

| 4,448,528 A | 5/1984 | McManus |
| 4,608,599 A | 8/1986 | Kaneko et al. |
| 4,679,068 A | 7/1987 | Lillquist et al. |
| 4,751,571 A | 6/1988 | Lillquist |
| 4,967,276 A | 10/1990 | Murakami et al. |
| 5,005,083 A | 4/1991 | Grage et al. |
| 5,140,416 A | 8/1992 | Tinkler |
| 5,173,726 A | 12/1992 | Burnham et al. |
| 5,381,205 A | 1/1995 | Kotani et al. |
| 5,488,674 A | 1/1996 | Burt et al. |
| 5,534,696 A | 7/1996 | Johansson et al. |

(Continued)

FOREIGN PATENT DOCUMENTS

EP 0343634 A2 11/1989

(Continued)

OTHER PUBLICATIONS

US Statutory Invention Registration No. H1599 (Task et al.), Published Oct. 1, 1996.
U.S. Appl. No. 11/294,752, Office Action dated Oct. 18, 2006, 11 pages.
U.S. Appl. No. 11/294,752, Office Action dated Apr. 18, 2007, 8 pages.
U.S. Appl. No. 11/294,752, Office Action dated Jan. 9, 2008, 6 pages.
U.S. Appl. No. 11/294,752, Notice of Allowance dated Sep. 12, 2008, 7 pages.

(Continued)

*Primary Examiner* — David P Porta
*Assistant Examiner* — Faye Boosalis
(74) *Attorney, Agent, or Firm* — Fredrikson & Byron, P.A.

(57) ABSTRACT

An infrared (IR) light camera or sensor that provides temperature alarms. The temperature alarms may be audible, vibrational, and visual to indicate when a portion of the IR image meets user-defined alarm criteria. Visual alarms may be provided by displaying on a camera display unit the portions of the IR image that meet the alarm criteria.

35 Claims, 19 Drawing Sheets

U.S. PATENT DOCUMENTS

| | | | |
|---|---|---|---|
| 5,781,336 A | 7/1998 | Coon et al. | |
| 5,808,350 A | 9/1998 | Jack et al. | |
| 5,832,325 A | 11/1998 | Ito et al. | |
| 5,910,816 A | 6/1999 | Fontenot et al. | |
| 5,944,653 A | 8/1999 | Bonnell et al. | |
| 5,974,272 A | 10/1999 | Kiesow et al. | |
| 6,009,340 A | 12/1999 | Hsia | |
| 6,020,994 A | 2/2000 | Cook | |
| 6,031,233 A | 2/2000 | Levin et al. | |
| 6,208,459 B1 | 3/2001 | Coon et al. | |
| 6,222,187 B1 | 4/2001 | Shivanandan | |
| 6,232,602 B1 | 5/2001 | Kerr | |
| 6,335,526 B1 | 1/2002 | Horn | |
| 6,370,260 B1 | 4/2002 | Pavlidis et al. | |
| 6,373,055 B1 | 4/2002 | Kerr | |
| 6,417,797 B1 | 7/2002 | Cousins et al. | |
| 6,444,983 B1 | 9/2002 | McManus et al. | |
| 6,449,005 B1 | 9/2002 | Faris | |
| 6,560,029 B1 | 5/2003 | Dobbie et al. | |
| 6,570,156 B1 | 5/2003 | Tsuneta et al. | |
| 6,762,884 B2 | 7/2004 | Beystrum et al. | |
| 6,781,127 B1 | 8/2004 | Wolff et al. | |
| 6,798,578 B1 | 9/2004 | Beystrum et al. | |
| 6,806,469 B2 | 10/2004 | Kerr | |
| 6,849,849 B1 | 2/2005 | Warner et al. | |
| 7,034,300 B2 | 4/2006 | Hamrelius et al. | |
| 7,148,484 B2 * | 12/2006 | Craig et al. | 250/370.01 |
| 7,274,830 B2 | 9/2007 | Bacarella et al. | |
| 2002/0030163 A1 | 3/2002 | Zhang | |
| 2003/0133132 A1 | 7/2003 | Kiermeier et al. | |
| 2004/0001184 A1 | 1/2004 | Gibbons et al. | |
| 2004/0071367 A1 | 4/2004 | Irani et al. | |
| 2004/0169617 A1 | 9/2004 | Yelton et al. | |
| 2004/0169663 A1 * | 9/2004 | Bernier | 345/629 |
| 2004/0225222 A1 | 11/2004 | Zeng et al. | |
| 2004/0264542 A1 | 12/2004 | Kienitz | |
| 2006/0208169 A1 | 9/2006 | Breed et al. | |
| 2007/0235634 A1 | 10/2007 | Ottney et al. | |

FOREIGN PATENT DOCUMENTS

| | | |
|---|---|---|
| EP | 1339228 A1 | 8/2003 |
| GB | 2389989 A1 | 12/2003 |
| JP | 10293368 | 11/1998 |
| JP | 11112851 | 4/1999 |
| JP | 11285025 | 10/1999 |
| JP | 2002281491 | 9/2002 |
| JP | 2004072189 | 3/2004 |
| JP | 2005173879 | 6/2005 |
| WO | 01/96824 A1 | 12/2001 |

OTHER PUBLICATIONS

U.S. Appl. No. 11/625,140, Office Action dated Jan. 3, 2008, 7 pages.
U.S. Appl. No. 11/625,140, Notice of Allowance dated Jan. 3, 2008, 6 pages.
PCT/US2005/043825, International Search Report and Written Opinion, dated Dec. 15, 2006, 11 pages.
PCT/US2005/043825, International Preliminary Examination Report and Written Opinion, dated Dec. 15, 2006, 8 pages.
EP Application No. 072501968, European Search Report and Opinion dated Mar. 26, 2007, 4 pages.
U.S. Appl. No. 11/294,752, filed Dec. 5, 2005, Notice of Allowance, 9 pages.
U.S. Appl. No. 11/625,140, filed Jan. 19, 2007, Notice of Allowance, 6 pages.
Brochure, Insight 80 Series, Loki Data Products, Inc., Greensboro, NC.
Press Release, AGEMA Presents Superviewer II, Oct. 10, 1986.
ThermoVision(R) Superviewer II, Operating Instructions, Oct. 1990.
Brochure, VideoTherm 96, Portable Infrared Imaging System with Integrated Visible Camera.
Brochure, VideoTherm 300 Series, ISI Group, Inc., Albuquerque, NM, 1994.
Manual, VideoTherm 300 Series, ISI Group, Inc., Albuquerque, NM, Jun. 1993.
Manual, AGEMA 480, Agema Infrared Systems, AB, 1992.
Brochure, Insight STARsight Thermal Imaging System, Insight Vision Systems, Kensington, MD, Aug. 23, 1991.
Brochure, Avio, TVS-5000 Series, Nippon Avionics Co. Ltd., Minato-ku, Tokyo, Japan.
Brochure, Hughes Probeye 4000-3000, Hughes Aircraft Company, Carlsbad, California.
Brochure, Inframetrics, Model 600L IR Imaging Radiometer, Inframetrics The Infrared Specialists, Bedford, MA, Brochure No. 600L-S04622-5M-0488-AKI/CP.
Brochure, Inframetrics, ThermaGRAM, Thermal Image Processing System, Inframetrics, Billerica, MA, Nov. 1991.

* cited by examiner

VISIBLE LIGHT AND IR COMBINED IMAGE CAMERA

RELATED APPLICATIONS

The present application is a continuation of U.S. patent application Ser. No. 11/294,752, filed Dec. 5, 2005, now U.S. Pat. No. 7,538,326 which in turn claims priority to U.S. Provisional Patent Application No. 60/633,078, filed Dec. 3, 2004, the disclosures of which are herein incorporated by reference in their entirety.

BACKGROUND

Many infrared cameras today produce an image (IR image) of a scene using only energy in the far-infrared portion of the electromagnetic spectrum, typically in the 8-14 micron range. Images obtained using these cameras assign colors or gray-levels to the pixels composing the scene based on the intensity of the IR radiation reaching the camera's sensor elements. Because the resulting IR image is based on the target's temperature, and because the colors or levels displayed by the camera do not typically correspond to the visible light colors of the scene, it can be difficult, especially for novice users of such a device, to accurately relate features of interest (e.g. hot spots) in the IR scene with their corresponding locations in the visible-light scene viewed by the operator. In applications where the infrared scene contrast is low, infrared-only images may be especially difficult to interpret.

An infrared scene is a result of thermal emission and, not all, but most infrared scenes are by their very nature less sharp compared to visible images which are a result of reflected visible light. For example, considering an electric control panel of an industrial machine which has many electrical components and interconnections, the visible image will be sharp and clear due to the different colors and well defined shapes. The infrared image may appear less sharp due to the transfer of heat from the hot part or parts to adjacent parts.

When panning an area with an infrared camera looking for hot or cold spots, one can watch the camera display for a visible color change. However, sometimes the hot or cold spot may be small and the color change may go unnoticed. To aid in the identification of hot or cold spots, infrared cameras often indicate the hot spot or cold spot location via a visible cursor or other graphical indicator on the display. The temperature of such hot spots, calculated using well-known radiometric techniques (e.g., establishing or measuring a reference temperature), is often displayed nearby the cursor. Even with the color change and the hot spot indications, it can be difficult to accurately relate the hot spot (or other features of interest) in the camera display's IR imagery with their corresponding locations in the visible-light scene viewed by the operator.

To address this problem of better identifying temperature spots of interest, some cameras allow the operator to capture a visible-light image (often called a "control image") of the scene using a separate visible light camera built into the infrared camera. The FLIR ThermaCam® P65 commercially available from FLIR Systems of Wilsonville, Oreg. is an example of such a camera. These cameras provide no capability to automatically align, or to merge the visible-light and infrared images in the camera. It is left to the operator to manually correlate image features of interest in the infrared image with corresponding image features in the visible-light image.

Alternatively, some infrared cameras employ a laser pointer that is either built into, or affixed to the camera. The FLIR ThermaCam® E65 commercially available from FLIR Systems of Wilsonville, Oreg. is an example of such a camera. This laser pointer projects a visible point or area onto the target, to allow the user to visually identify that portion of the target scene that is being displayed by the infrared camera. Because the laser pointer radiation is in the visible spectrum, it is not visible in the infrared image. As a result, the laser pointer is of limited value in infrared cameras. This can be problematic when the location of a hot or cold spot is difficult to identify. For example, large industrial control panels often have many components that are similar in shape and packed tightly together. It is sometimes difficult to determine the exact component that is causing a thermal event, such as a hot spot in the infrared camera image.

Other infrared temperature measurement instruments may employ either a single temperature measurement sensor, or a very small number of temperature sensors arrayed in a grid pattern. Single point instruments typically provide a laser pointing system to identify the target area by illuminating the point or area viewed by the single temperature sensor element, e.g. Mikron M120 commercially available from Mikron Infrared Inc. of Oakland, N.J. Alternatively, some systems employ an optical system that allows the user to visually identify the point in the target scene that is being measured by the instrument by sighting through an optical path that is aligned with the temperature sensor, e.g. Mikron M90 commercially available from Mikron Infrared Inc. of Oakland, N.J. Instruments with more than one sensor element typically provide a very crude infrared image made up of a small number of scene pixels, each with a relatively large instantaneous field of view (IFOV), e.g. IRISYS IRI 1011 commercially available from Advanced Test Equipment of San Diego, Calif. It can be very difficult to accurately identify features of interest using such images.

SUMMARY

Embodiments of an infrared (IR) light camera or sensor that provide temperature alarms are disclosed. The temperature alarms may be audible, vibrational, and/or visual to indicate when a portion of the IR image meets user-defined alarm criteria. Visual alarms may be provided by displaying on a camera display unit the portions of the IR image that meet the alarm criteria.

Certain embodiments of the invention include a camera for producing visible-light (VL) images and infrared (IR) images. The camera includes an array of VL sensors for sensing VL images of a target scene and an array of IR sensors for sensing IR images of the target scene. The camera in such embodiments includes a display for concurrently displaying portions of the sensed IR images and the sensed VL images of the target scene, registered together to form a composite image. The display in such embodiments displays only the portions of the sensed IR images meeting at least one alarm criterion.

Certain embodiments of the invention include a camera for sensing IR images, where the camera includes an array of IR sensors for sensing IR images of a target scene and an alarm module for providing an audible or vibrational alarm when a portion of the sensed IR image meets at least one user-defined alarm criterion.

Certain embodiments of the invention include a hand-held camera for producing IR images, where the camera includes an IR camera module supported by a camera housing and having IR sensors and IR optics. The IR sensors include an array of IR sensors for sensing IR images of a target scene. The camera in such embodiments also includes a display supported by the camera housing for displaying portions of the sensed IR images of the target scene where the display displays only the portions of the sensed IR images meeting at least one user-defined alarm criterion. The at least one user-defined alarm criterion includes a relative threshold defined as a range of temperatures relative to a reference temperature, whereby the portions of the sensed IR images within the range are displayed.

Certain embodiments of the invention include an IR alarm sensor that has at least one IR sensor for sensing IR radiation from a target and an alarm module for providing an audible or vibrational alarm when the sensed IR radiation meets at lease one alarm criterion.

DETAILED DESCRIPTION

System Description

Figure 1:
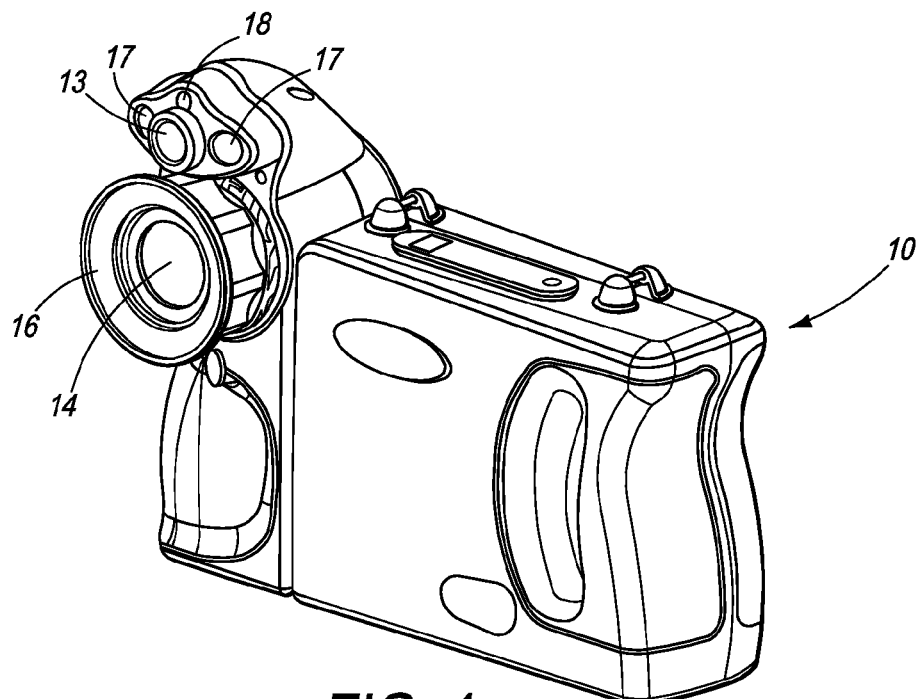
FIGS. 1 and 2 are front and rear perspective views of a camera according to an embodiment of the invention.
Figure 2:
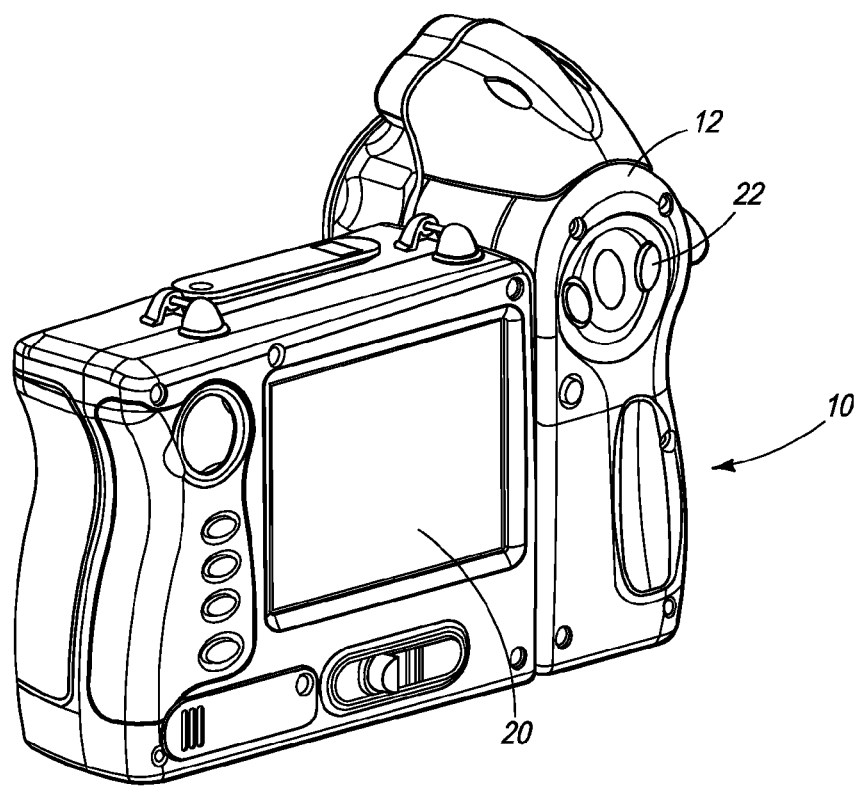

FIGS. 1 and 2 are perspective views of the front and the back of a camera 10 according to an embodiment of the invention. The housing includes an infrared camera module and a visible-light camera module. In particular, the camera 10 includes a camera housing 12, a Visible-Light (VL) lens 13, an infrared lens 14, focus ring 16 and a laser pointer 18 as well as various electronics located within the housing as will be described with reference to FIG. 3. In an embodiment, an LED torch/flash 17 is located on each side of the VL lens 13 to aid in providing enough light in dark environments. A display 20 is located on the back of the camera so that infrared images, visible light images and/or blended images of Infra-red and Visible-Light may be viewed. In addition, target site temperature (including temperature measurement spot size) and distance readings may be displayed. Also located on the back of the camera are user controls 22 to control the display mode and activate or deactivate the laser pointer.

Figure 3:
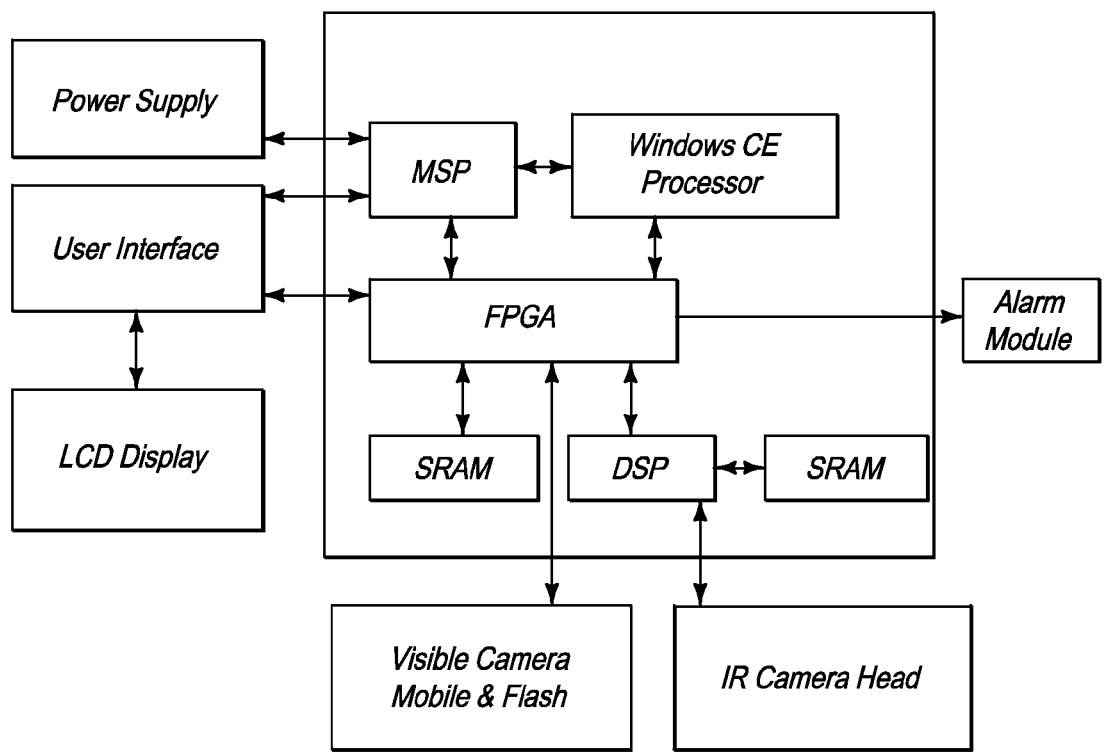
FIG. 3 shows a block diagram of a representative camera system according to an embodiment of the invention that can be used to practice embodiments of the invention.

FIG. 3 shows a block diagram of a representative camera system according to an embodiment of the invention that can be used to practice embodiments of the invention.

The Visible-Light camera module includes a CMOS, CCD or other types of visible-light camera, LED torch/flash and a laser pointer. This camera streams RGB image display data (e.g. 30 Hz) to the FPGA for combination with infrared RGB image data and then sends the combined image data to the display.

The Analog Engine interfaces with and controls the infrared sensor, and streams raw infrared image data (e.g. 30 Hz) to the DSP. The DSP performs computations to convert the raw infrared image data to scene temperatures, and then to RGB colors corresponding to the scene temperatures and selected color palette. For example, U.S. Pat. No. 6,444,983 entitled "Microbolometer Focal Plane Array With Controlled Bias," assigned to the present assignee, is incorporated herein in its entirety, discloses such an infrared camera. The DSP then streams the resulting infrared RGB image display data to the FPGA where it is combined with the VL RGB image data and then sends the combined image data to the display.

The Embedded Processor Card Engine includes a general-purpose microprocessor that provides a graphical user interface (GUI) to the camera operator. This GUI interface consists of menus, text, and graphical display elements that are sent to the FPGA, where they are buffered in SRAM and then sent to the display.

The MSP430 interfaces with the user interface including camera buttons, mouse, LCD backlight, and the smart battery. It reads these inputs and provides the information to the embedded processor card engine where it is used to control the GUI and provides other system control functions.

The FPGA drives the display(s) (LCD and/or TV, for example) with combined visible-light image data, infrared image data, and GUI data. The FPGA requests both the visible-light and infrared image data from the VL and infrared camera modules and alpha-blends them together. It also alpha-blends the resulting display image with the GUI data to create a final blended image that is sent to the LCD display. Of course the display associated with the embodiments of the invention is not limited to an LCD-type display. The FPGA operates under control of the DSP, which is further controlled by the embedded processor card engine. The degree of image alpha-blending and the display mode, i.e. picture-in-a-picture, full screen, color alarm and zoom mode, is controlled by the user through the GUI. These settings are sent from the embedded processor card engine to the DSP which then configures the FPGA properly.

Optical Configuration

Embodiments of the invention combine an engine of a real-time visible-light camera with an engine of a real-time infrared camera close to each other in the same housing such that the optical axes are roughly parallel to each other.

Figure 4:
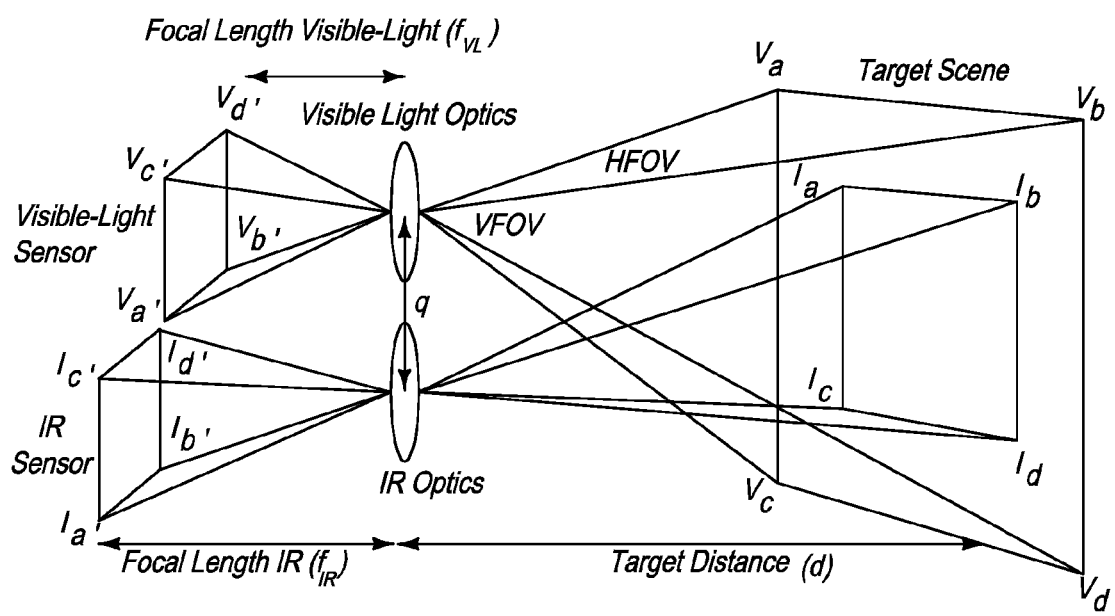
FIG. 4 is a diagram showing the optical path and sensor configuration of the camera.

The camera according to the embodiments of the invention places the engine or module of a real-time visible-light camera in the housing of a real-time infrared camera. The placement is such that the visible and infrared optical axes are as close as practical and roughly parallel to each other, for example, in the vertical plane of the infrared optical axis. Of course other spatial arrangements are possible. The visible light camera module, i.e., VL optics and VL sensor array, are chosen to have a larger field of view (FOV) than the infrared camera module. FIG. 4 is a diagram showing the optical path and sensor configuration of the camera. As shown in the diagram, there are two distinct optical paths and two separate sensors. One for visible-light, and one for infrared. Because the optical paths for the sensors are different, each sensor will "see" the target scene from slightly different vantage points thereby resulting in parallax error. As will be described in detail hereinafter, the parallax error is corrected electronically using software manipulations. This provides the capability to electronically correct the displayed images for parallax. In certain embodiments, the visible-light optics and sensor are chosen so that their respective field of views (FOV) are different, i.e. one is larger than the other. For instance, in one embodiment, the VL FOV is greater than the infrared FOV. This provides cost effectiveness. Presently, for a given number of pixel sensors, visible light sensor arrays are much cheaper than infrared sensor arrays. Accordingly, for a given field of view and resolution (instantaneous field of view), visible light sensor arrays are cheaper than infrared sensor arrays.

In certain embodiments, the visible light optics are such that the visible light camera module remains in focus at all usable distances. Only the infrared lens needs focus adjustment for targets at different distances.

Parallax Correction and Display Modes

Figure 5:
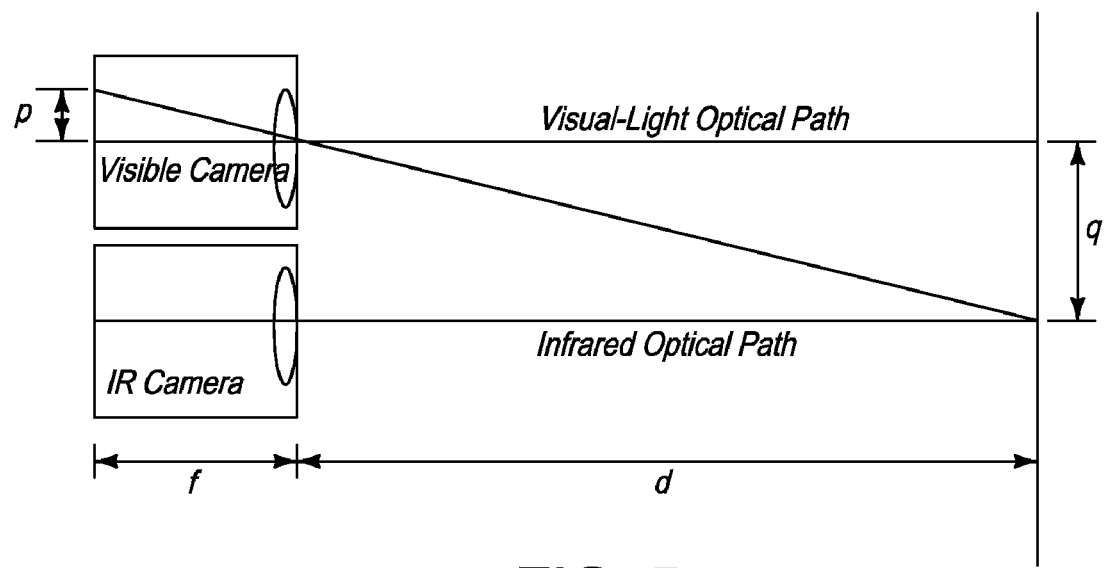
FIG. 5 shows geometrically, the derivation of the parallax equation.

FIG. 5 shows geometrically, the derivation of the parallax equation (eq. 1). As can be seen by the equation, parallax can be reduced by minimizing the distance (q) between the visible-light and infrared optical apertures, and also by choosing short focal length lenses. The camera design will typically physically fix (q). In certain embodiments, the focal lengths of the visible-light and infrared lens (f) can be altered in the field by changing lenses, or using optical systems that include multiple focal lengths or continuous zoom. In the embodiments with fixed focal length lenses, the focal lengths remain constant during operation once the lenses are installed. Hence, during camera operation, parallax is simply a function of distance (d) to the target. In the embodiment shown, the focal length (f) of each lens is the same. In alternate embodiments, the focal lengths (f) of the infrared lens and the visible lens may differ from each other.

The camera corrects the visible-light and infrared images for parallax and provides several different methods to display the registered images to the operator. These methods are described below. In general, parallax error corrections are based on the infrared focus distance as will be described hereinafter. However, parallax error may also be corrected by determining the distance from the target image (other than via focus distance) by schemes known to those of ordinary skill in the art.

The camera according to the embodiments of the invention can operate in one of three display modes; 1) full screen visible, infrared and/or blended, 2) picture-in-a-picture such as partial infrared image in a full screen visible image, and 3) infrared color alarms in visible-light images. In any one of these display modes, temperatures will be recorded and can be displayed in the infrared portion of the image. Temperatures can also be displayed on a visible-light only image from the recorded but not displayed infrared image.

Figure 6:
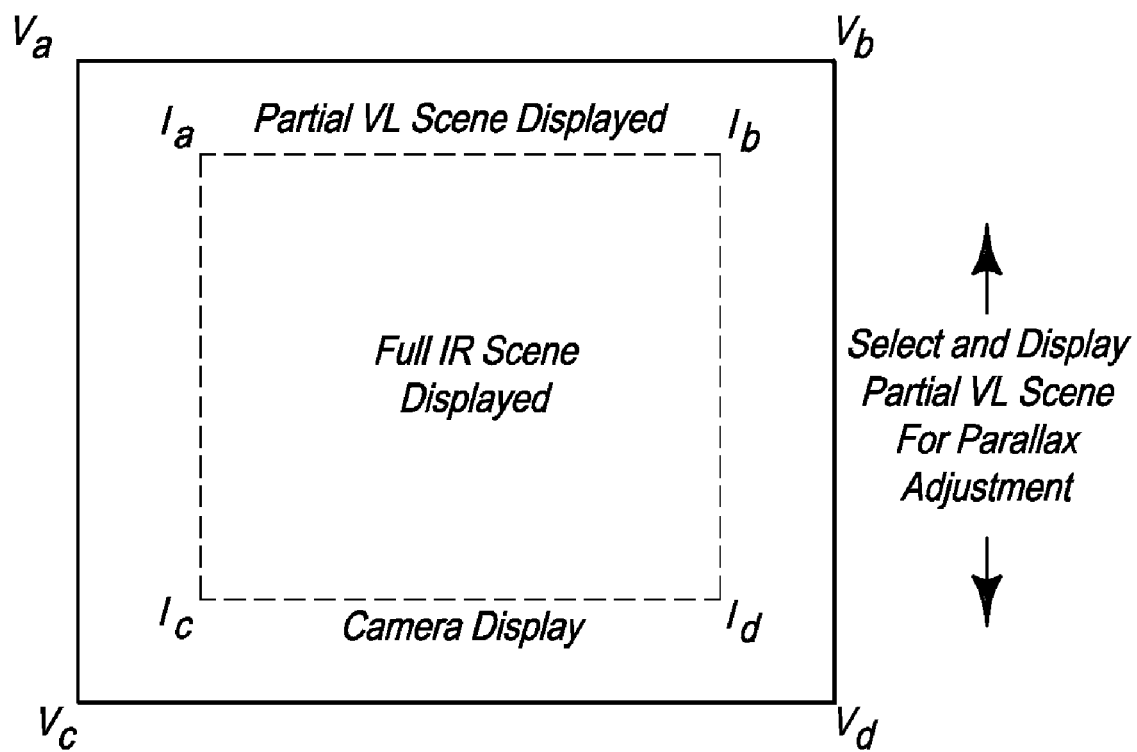
FIG. 6 shows the (Full-Screen, Full-Sensor infrared)/(Full-Screen, Partial-Sensor Visible-Light) scene display mode.

In the full screen display mode, an operator has a choice of selecting for display a full screen visible-light only image, a full screen infrared only image, or a full screen blend of visible-light and infrared images. In an embodiment of the invention, the display is about 320 by 240 pixels and is represented by the dashed-line box shown in FIG. 6. The infrared sensor has 160 by 120 pixels and the visible-light sensor has 1280 by 1024 pixels. These particular dimensions are given by way of example and are not limiting to any of the embodiments of the invention. Thus, the infrared sensor, the VL sensor and display may each be individually larger or smaller than the particular examples given. FIG. 6 shows a diagram of the mode where the full 160 by 120 infrared image is interpolated to fill the camera display. Based on the display mode chosen, a portion of the 1280 by 1024 visible-light image is windowed to match the infrared window. Since the number of selected visible-light sensor elements does not necessarily match the 320 by 240 pixels of the camera display, the visible-light image is scaled to match the camera display. After parallax error correction, each resulting infrared display pixel will represent the same instantaneous field of view (IFOV) as its corresponding visible-light display pixel. Because the two images are matched, the camera operator can easily identify points-of-interest in the infrared image with objects in the visible-light image simply by noting where the features of interest overlie each other in the two images. In the embodiment shown in FIG. 6, the display mode is entitled "Full-Screen, Full-Sensor Infrared and Full-Screen, Partial-Sensor Visible-Light display mode." Additional display modes are discussed further below.

Figure 7:
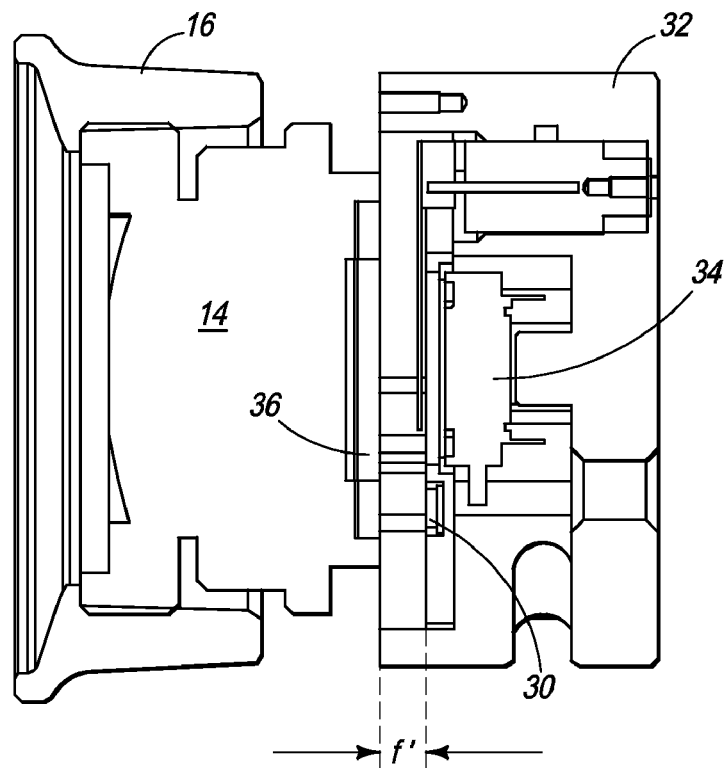
FIGS. 7 and 8 are cross-sectional views of an infrared camera module with a magnet and Hall-Effect sensor according to an embodiment of the invention.
Figure 8:
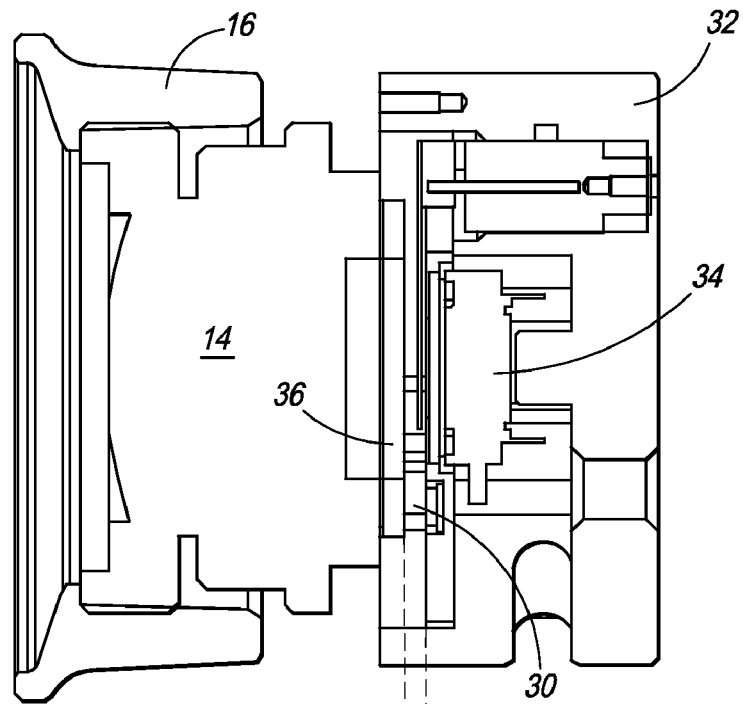

Parallax error between the visible-light image and the infrared image is corrected automatically by the camera. This process is referred to as registering. In order to apply the proper parallax correction, the camera must first determine the distance to the target object of interest. One method to determine the target distance is to sense the focus position of the infrared lens using a Hall-effect sensor. FIGS. 7 and 8 show a sectional view of camera 10 taken from front to rear through the center of infrared lens 14. Referring to FIGS. 7 and 8, a Hall-Effect sensor 30 is fixed in the housing 32 with respect to the infrared sensor array 34 to sense the proximity of a magnet 36 attached to the back of the IR lens 14. As the focus of the lens is changed via rotation of focus ring 16, the distance f' between the magnet 36 and the Hall-Effect sensor 30 changes, resulting in an output from the Hall-Effect sensor that is proportional to focus position. (The focus of the lens could be changed by moving the lens or moving the infrared sensor array.) This focus position is used to derive an estimate of the distance to the target. The infrared lens focus position provides an especially convenient estimate of distance because typical infrared lenses have a low F-number, resulting in a shallow depth of field. The Hall-Effect sensor may, in one embodiment, be fixed on the infrared sensor array. In addition, the positions of the Hall-Effect sensor and magnet may be reversed from that shown.

In the embodiment shown in FIGS. 7 and 8, the magnet 36 is a ring that encircles an interior surface of the focus ring 16 facing the infrared sensor array 34. The Hall-Effect sensor 30 is fixed in the camera housing 32 a small distance from of the infrared sensor array 34. The distance between the Hall-Effect sensor and the magnet represents the distance f shown in FIGS. 7 and 8. FIG. 7 shows the lens positioned for near focus and FIG. 8 shows the lens positioned for far focus in which case the magnet is closer to the Hall-Effect sensor than in FIG. 7. Mechanisms and methods other than those described above for a Hall effect sensor may, of course, be employed to determine the distance to target. Such equivalent mechanisms or methods would be known to those with skill in the art. The Hall-Effect sensor is one convenient method.

Estimating the distance between the target and the camera is a valuable safety feature. For example, OSHA has specific safety distance requirements when inspecting high voltage electrical cabinets. Thus, using the camera according to the embodiments of the invention, one can display the distance to the target on the display so that the camera operator is assisted in complying with OSHA's safety requirements.

In addition, it can be valuable to know the size of the spot on the target that is being measured (instantaneous field of view spot size). Because the spot size is a function of distance and the embodiments of the invention have the ability to measure (or rather estimate) distance that is needed to correct parallax error, spot size can be calculated as a function of distance and displayed to the camera operator via the display.

Figure 9:
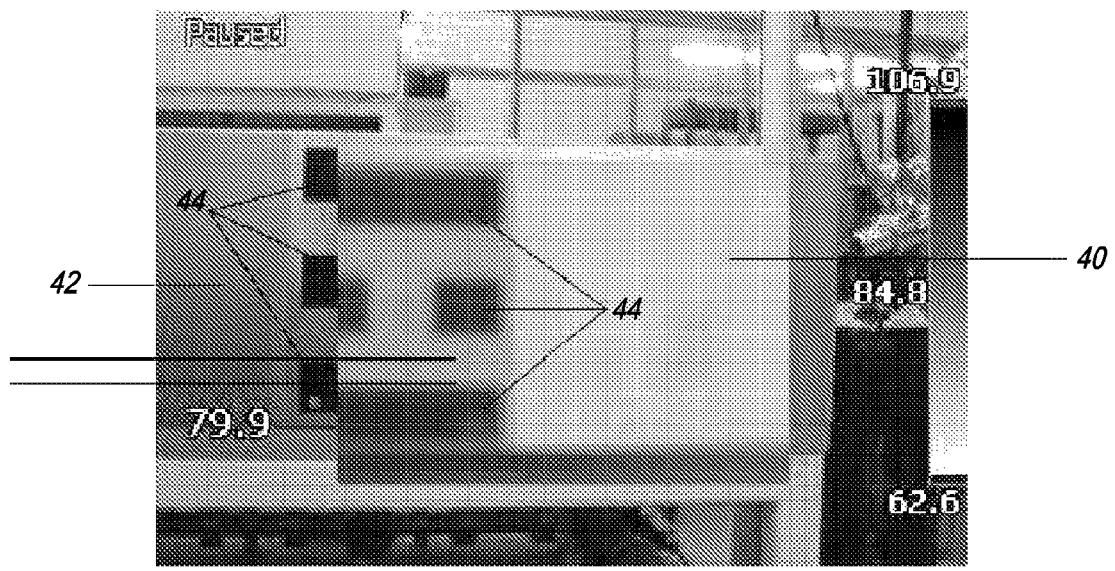
FIG. 9 shows combined visible-light and infrared images uncorrected for parallax error.
Figure 10:
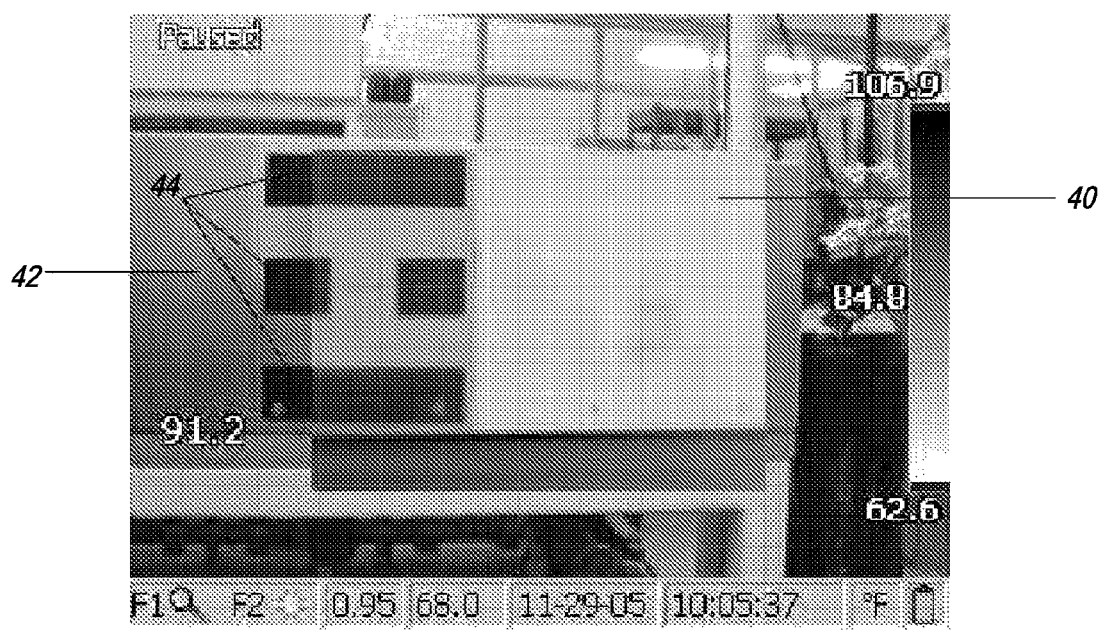
FIG. 10 shows the same images corrected for parallax error.

The lens position sensor value to focus distance correlation for each infrared lens is determined at the factory and stored with other camera calibration data in the camera's non-volatile memory. This calibration data includes X and Y image offsets calculated for each focus distance. By utilizing the sensed infrared lens focus position and the factory calibration data, the correct X and Y sensor offsets of the partial area from the visible-light sensor to be displayed can be computed and used to select the appropriate visible-light sensor area for the current infrared focus distance. That is, as the focus distance of the infrared lens is changed, different areas of the visible-light sensor image are extracted and displayed, resulting in registration of the infrared and visible-light images for objects at the focus distance. FIG. 9 shows combined picture-in-a-picture display of visible-light and infrared images misaligned, i.e. uncorrected for parallax error. FIG. 10 shows the same images corrected for parallax error. Referring to FIG. 9, the center quarter of the display shows a blurry (unfocused) and unregistered infrared-only image 40 placed within the surrounding framework of a visible only image 42. The rectangular dark sections 44 in the image are misaligned (unregistered) showing the parallax error resulting from the unfocused infrared image 44. Referring to FIG. 10, the rectangular dark sections 44 in the infrared image 40 are registered with the portions of such sections 44 in the visible only image 42, showing that infrared image is now properly focused. FIGS. 9 and 10 highlight a method by which a user of camera 10 could focus the infrared image 40 by merely rotating focus ring 16 until image 40 is properly registered. Although FIGS. 9 and 10 show the center quarter of the display as infrared only, this same method and technique could be used for a blended visible and infrared image, whether the images are shown picture in picture, full display, alarm mode, or other display modes.

Note that objects within the scene that are not at the focus distance will still exhibit a parallax error. Nearer objects will exhibit a larger parallax error than objects beyond the focus distance. In practice, parallax error becomes negligible beyond a focus distance of approximately 8 feet for lenses used with typical infrared cameras. Also note that parallax errors can only be corrected down to a limited close focus distance to the camera (typically about 2 feet). This distance is determined by how much "extra" field of view the visible-light sensor provides as compared to the infrared sensor.

When an image is captured, the full visible-light image and the full infrared image with all of the ancillary data are saved in an image file on the camera memory card. That part of the visible-light image not displayed which lies outside of the camera display dimensions when the image was taken is saved as part of the visible-light image. Later, if an adjustment in the registration between the infrared and visible-light image is needed, either in the camera or on a computer, the full visible-light image is available.

The camera allows the operator to adjust the registration of the visible-light and infrared image after an infrared/Visible-light image pair is captured and stored in memory. One way to accomplish this is to use the infrared lens position as an input control. This allows the operator to fine-tune the registration, or to manually register objects in the scene that were not at the infrared focus distance when the images were captured, simply by rotating the focus ring on the lens.

The visible-light image, when it is the only displayed image, is displayed preferably in color, although it need not be. When it is blended with the infrared image, the visible-light image is converted to gray scale before it is blended so that it only adds intensity to the colored infrared image.

Figure 11:
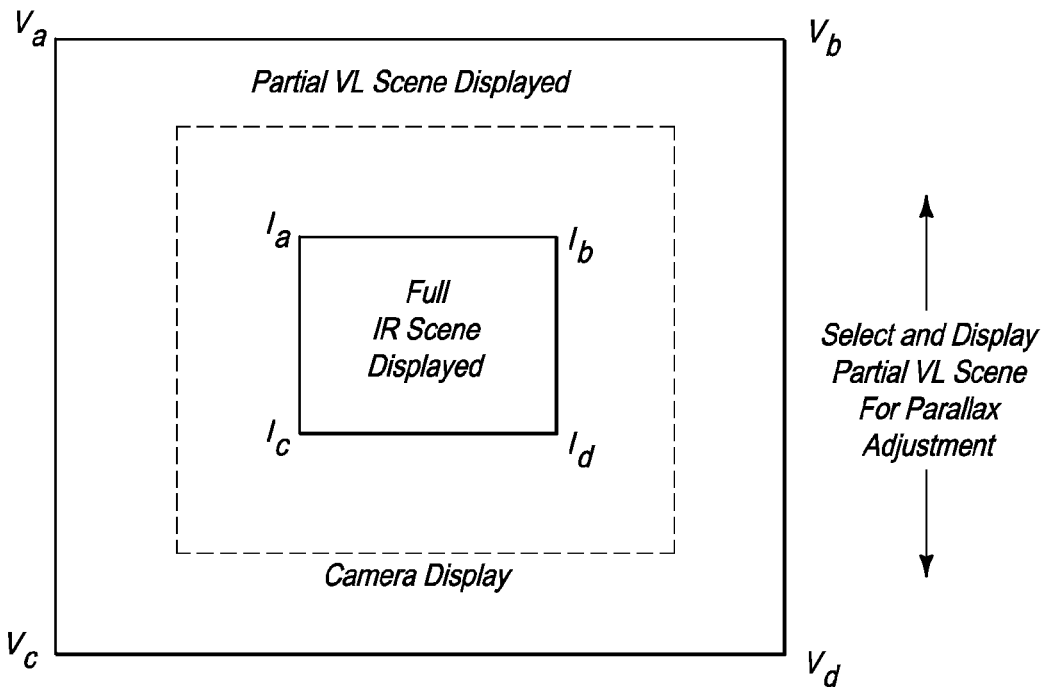
FIG. 11 shows the (Partial-Screen, Partial-Sensor infrared)/(Full-Screen, Full-Sensor Visible-Light) scene display mode. In this mode, the camera uses all of the visible-light sensor elements to fill the display.

FIG. 11 shows the scene display mode entitled "Partial-Screen, Full-Sensor Infrared and Full-Screen, Partial-Sensor Visible-Light display mode." In this mode, the camera uses all of the available infrared sensor elements to provide an infrared image that fills only a central area of the camera display. Standard image processing techniques (e.g. scaling and windowing, for example) are used to fit the infrared image into the desired area of the display. The IFOV of the visible-light image is adjusted to match the IFOV of the infrared image and then a portion of the visible-light image is selected to fill the full display and to match the infrared image in the center of the display. The center quarter of the display can be infrared only, visible-light only or a blend of the two. The remaining three-quarters of the display (outer framework) is visible-light only.

The camera uses the same technique in this mode as that described for the full screen mode to correct for parallax.

Figure 12:
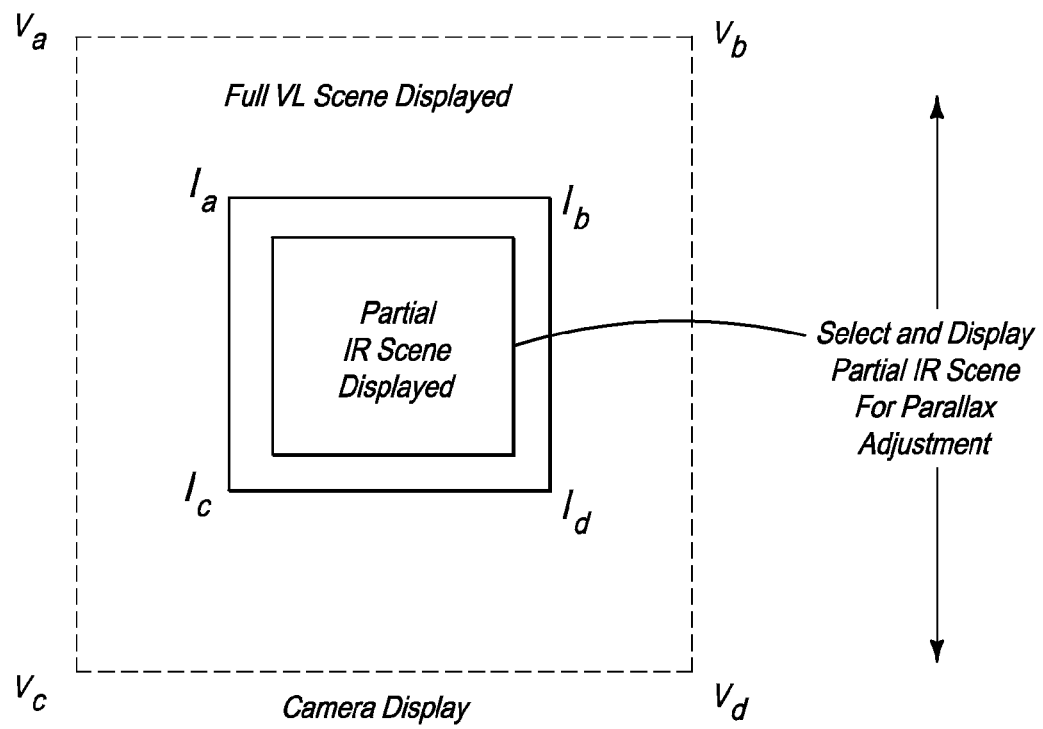
FIG. 12 shows the (Partial-Screen, Full-Sensor infrared)/(Full-Screen, Partial-Sensor Visible-Light) scene display mode. In this mode, the camera uses all of the available infrared sensor elements to provide an infrared image that fills only a central area of the camera display.
Figure 13:
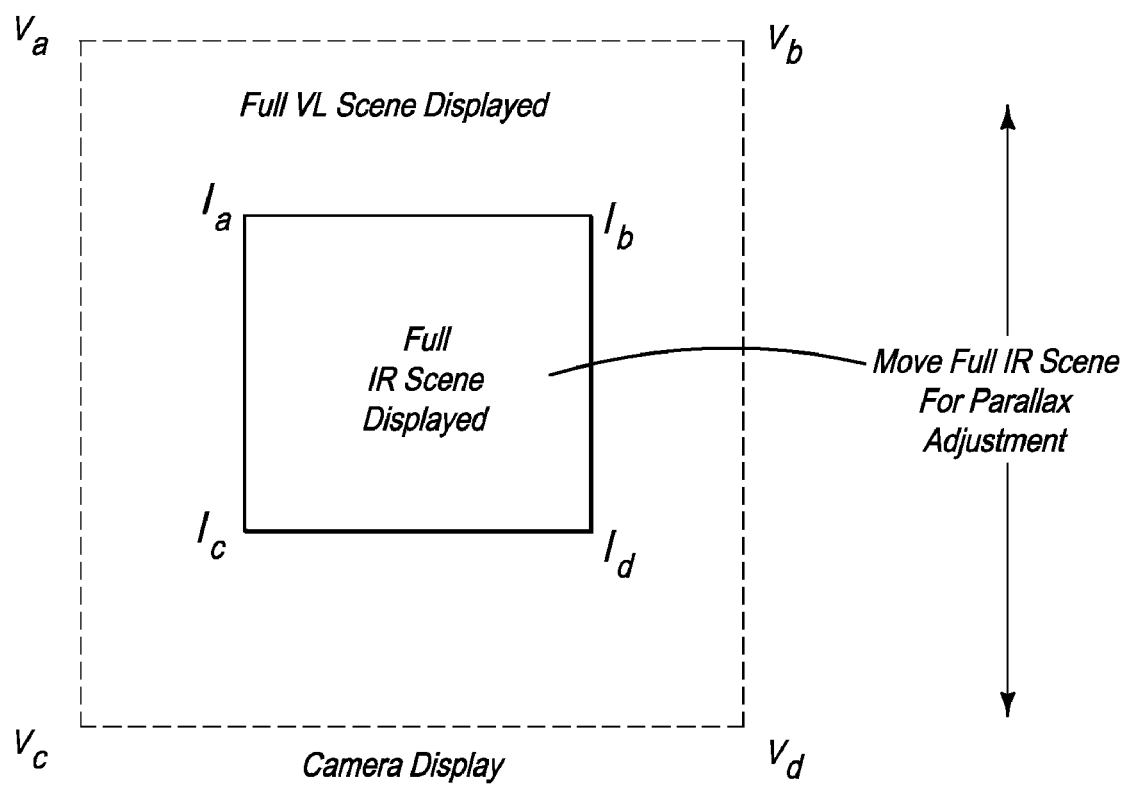
FIG. 13 shows the (Partial-Screen, Full-Sensor infrared)/(Full-Screen, Full-Sensor Visible-Light) scene display mode. In this mode, the camera uses all of the infrared and all of the visible-light sensor elements to construct the displayed images.

Alternatively, instead of matching the visible-light image to the infrared image just the opposite may be done. FIGS. 12 and 13 illustrate this technique. FIG. 12 shows a picture-in-a-picture "Partial-Screen, Partial-Sensor infrared and Full-Screen, Full-Sensor Visible-Light scene display mode." In this mode, the camera uses all of the visible-light sensor elements to fill the display. If the number of visible-light sensor elements does not match the number of display pixels, the camera uses standard imaging techniques to create an image that fills the display screen. A portion of the available infrared sensors is chosen to provide the infrared image. The infrared image is windowed and matched so that the resulting infrared display pixels provide the same IFOV as the visible-light image display pixels.

The camera uses similar techniques to those described for FIG. 6 to correct for parallax. However, in this mode, different areas of the infrared sensor are selected to match the center region of the visible-light image as the infrared focus distance is changed. Note that in this mode, the infrared image is always displayed in a fixed position in the middle of the display.

FIG. 13 shows the "Partial-Screen, Full-Sensor infrared and Full-Screen, Full-Sensor Visible-Light scene display mode." In this mode, the camera uses all of the infrared and all of the visible-light sensor elements to construct the displayed images. The visible-light image is scaled to completely fill the display. The infrared image is windowed and scaled so that the IFOV of the resulting display pixels match the visible-light image. The resulting image is displayed over the matching area of the visible-light image.

Like the previously described mode, parallax is corrected by moving the infrared image scene to align it with the visible-light image scene.

Alpha-Blending

Alpha-blending is a process of ratioing the transparency/opaqueness of two images superimposed on one pixel. If the Alpha=maximum, then the first image is opaque and the second is transparent and is so written to the display. If Alpha=0, then the first image is transparent and the second image is opaque and is so written to the display. Values in-between cause 'blending' (alpha blending) between the two sources, with the formula Display=Source 1*(Alpha/max_Alpha)+Source 2*((max_Alpha−Alpha)/max_Alpha).

Figure 14:
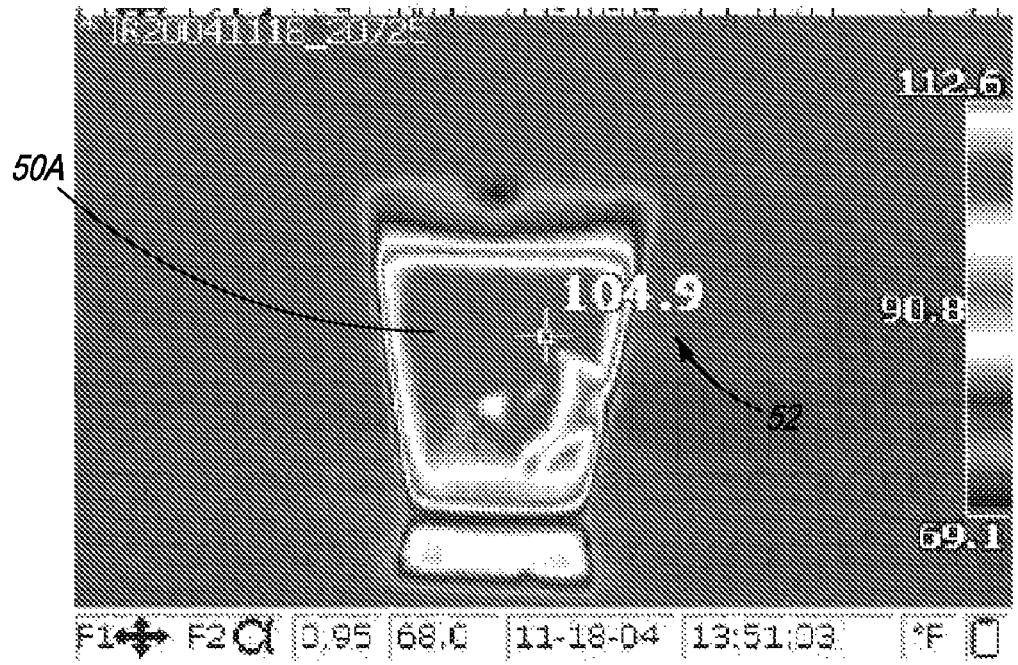
FIGS. 14-16 show respectively, an infrared only image of an insulated cup, a visible-light only image of the cup and a partial alpha-blended image of the cup.
Figure 15:
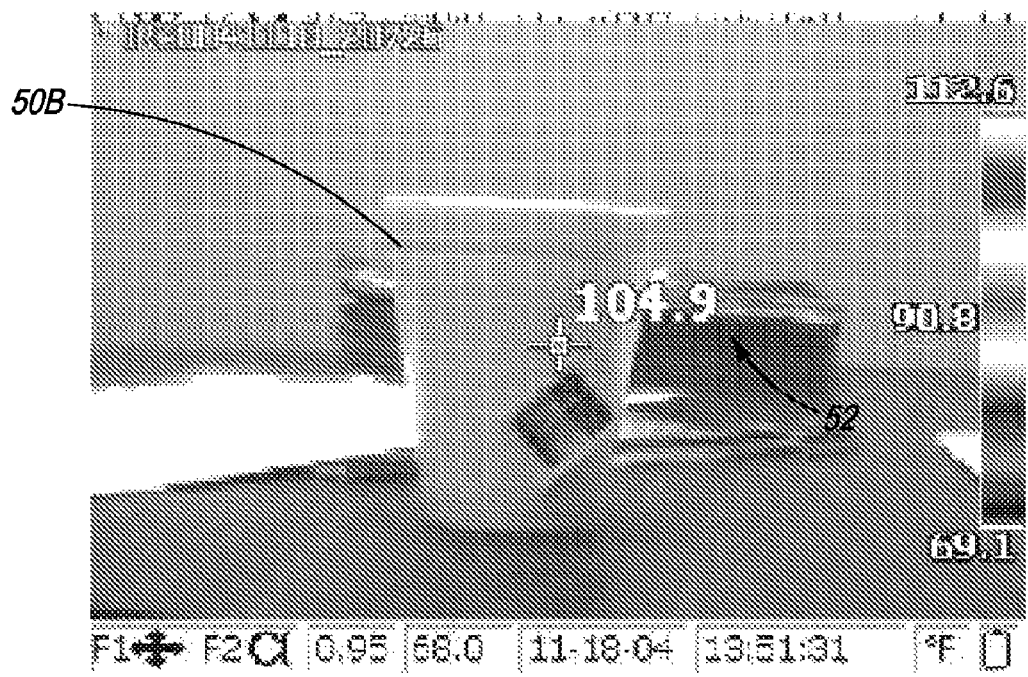
Figure 16:
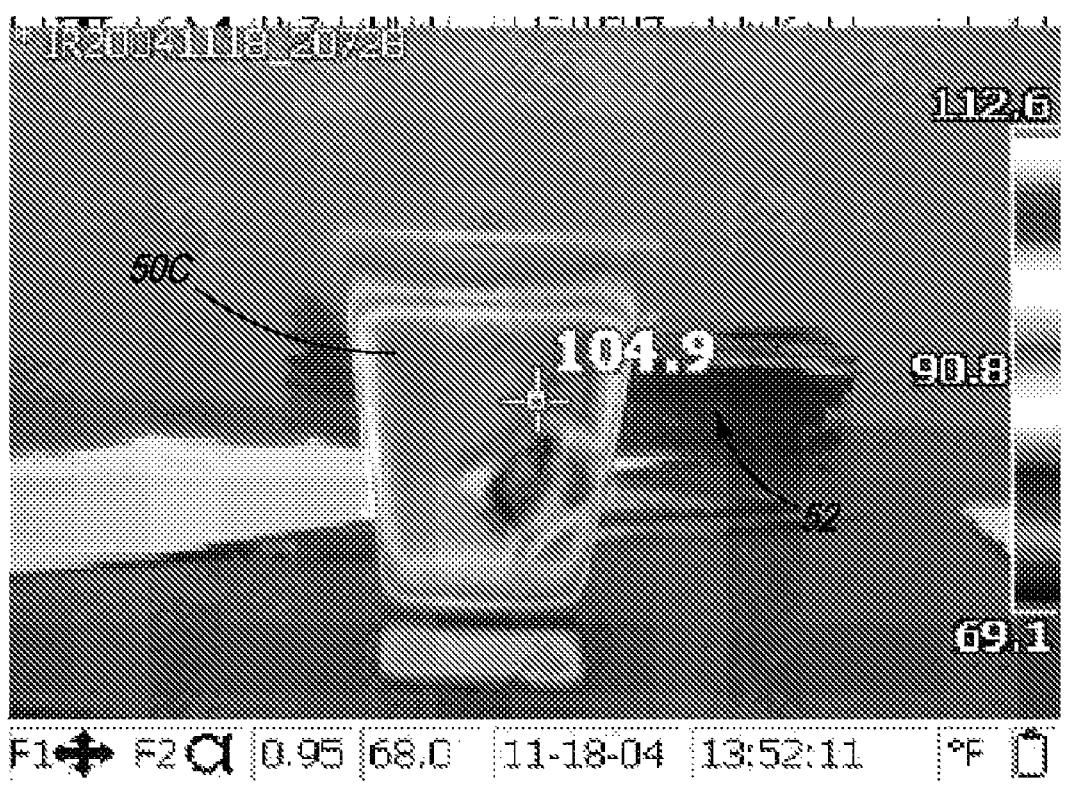

FIGS. 14-16, show respectively, an infrared only image of an insulated cup, a visible light (VL) only image of the cup, and a partial alpha-blending of the infrared and VL images.

The camera will enable the operator to adjust the alpha blending of the visible and infrared images from the extremes of infrared-only (FIG. 14) or visible-only (FIG. 15) to any combination of alpha blending between these two extremes (FIG. 16). Note that although the infrared image is not visible in FIG. 15, the underlying infrared image data is used to display the correct object temperature 52 in the visible light image. Thus, as the cursor is moved over the visible-light image, the temperature 52 associated with the cursor's location on the image is displayed.

The infrared and visible-light images can be displayed in either color or grayscale. When color is used to portray temperatures in the infrared image, the visible image in the overlap area can be displayed in grayscale only so that it doesn't excessively corrupt the infrared palette colors.

When an image is saved, both the visible and infrared images are saved individually so reconstructing images with different alpha blending can be accomplished later either in the camera, or with PC software.

Alarm Modes

Figure 17:
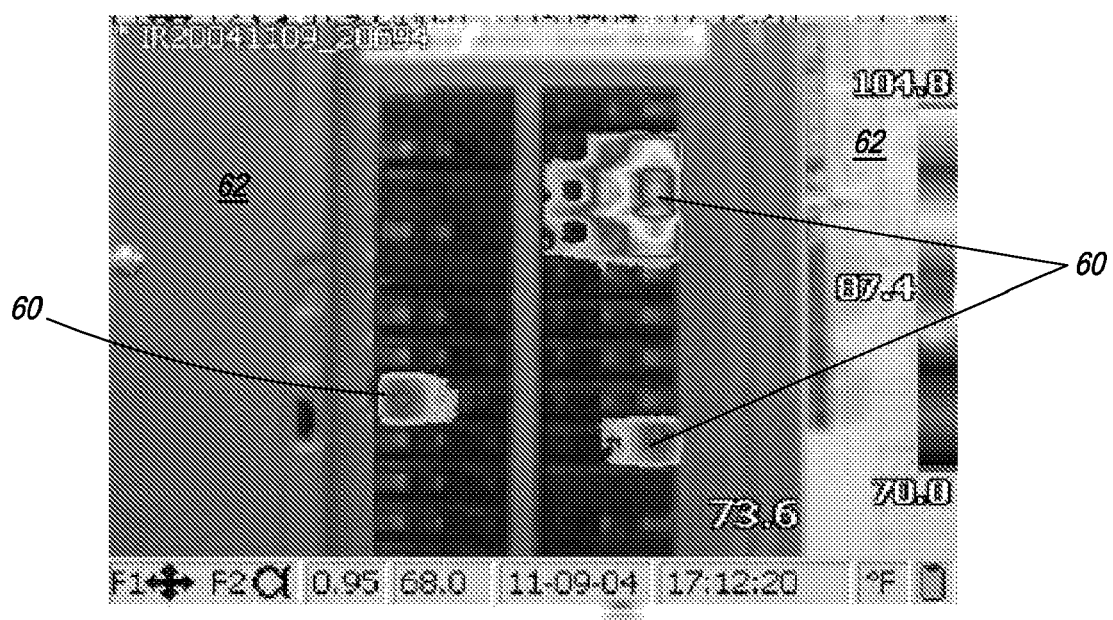
FIG. 17 shows an example of a "hot threshold" alarm mode display.

The camera supports several different visual alarm modes. These modes are used to call the operator's attention to areas of interest in the visible-light image by displaying an alpha-blended or infrared only image in areas that meet the alarm criteria as set by the user. FIG. 17 shows an example of the "hot threshold" alarm mode. Only those pixels in the infrared image that exceed a set temperature threshold (hotspots 60) are displayed. In the color alarm mode, the visible-light image 62 is switched to gray scale so that the infrared image stands out with no ambiguity. The camera can provide alarm modes, such as those described below. Other alarm modes are also possible.

Absolute hot threshold—infrared pixels above a defined temperature are alpha-blended with corresponding visible-image pixels.

Absolute cold threshold—infrared pixels below a defined temperature are alpha-blended with corresponding visible-image pixels.

Relative hot threshold—A temperature range is defined by the user. The temperature range is relative to the current hottest pixel (or average of a set number of hottest pixels) in the scene or from a previous scene or reference scene. Infrared pixels above the threshold defined by the current hottest pixel(s) in the scene minus a user defined or predetermined temperature range are alpha-blended with their corresponding visible-image pixels. For example, if the temperature range is 5 degrees, and the current hottest pixel(s) in the scene is 100 degrees, for example, all infrared pixels above 95 degrees in the scene will be alpha-blended with corresponding visible-light pixels.

Relative cold threshold—A temperature range is defined by the user. The temperature range is relative to the current coldest pixel (or average of a set number of coldest pixels) in the scene or from a previous scene or reference scene. Infrared pixels below the threshold defined by the current coldest pixel(s) in the scene plus a user defined or predetermined temperature range are alpha-blended with their corresponding visible-image pixels. For example, if the temperature range is 5 degrees, and the current coldest pixel(s) in the scene is 10 degrees, all infrared pixels below 15 degrees in the scene will be alpha-blended with corresponding visible-light pixels.

Absolute range (isotherm)—The operator enters a temperature range. Infrared pixels with a temperature within the set range are alpha-blended with their corresponding visible-light pixels. For example, the user enters a range of 80-100 degrees. All infrared pixels with a temperature value within the 80-100 degree range are alpha-blended.

Alarm flash mode—To further call attention to areas of interest, the camera may provide a mode whereby the alpha-blended areas are "flashed" by alternately displaying the alarmed pixels as visible-light only, and then either alpha-blended or infrared only.

The alarm modes identified above may also be indicated audibly or via vibration. Such audible or vibrational alarms may be useful in situations where hotspots are small enough to otherwise go unnoticed in the visual display. In embodiments that include audible or vibration alarms, the camera can generate such an alarm to alert the camera operator when, for instance, the camera detects an out of specification temperature or any of the other alarms modes identified above. Referring back to FIG. 3, the camera may include an alarm module connected to the FPGA that provides audible or vibrational alarms. The vibration mechanism can be similar to that used in cellular phones to alert persons of an incoming call.

PC Software

All of the image display techniques described for the camera can also be implemented in software that runs on a PC host computer and can be applied to images captured by the camera.

ADVANTAGES

Figure 18:
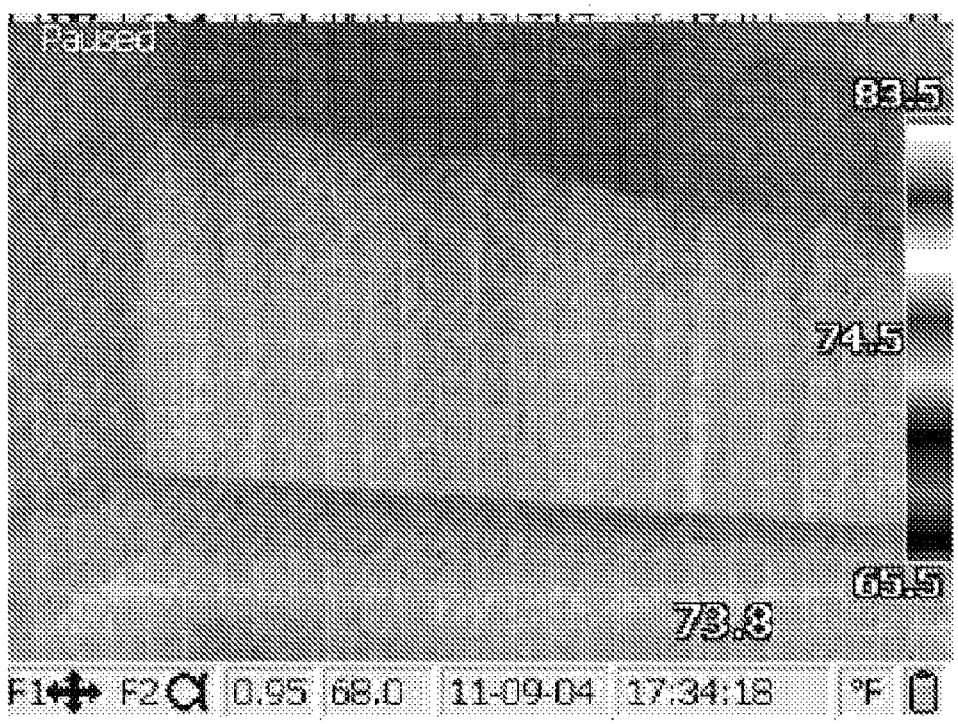
FIG. 18 shows a typical infrared image of a low infrared contrast scene.
Figure 19:
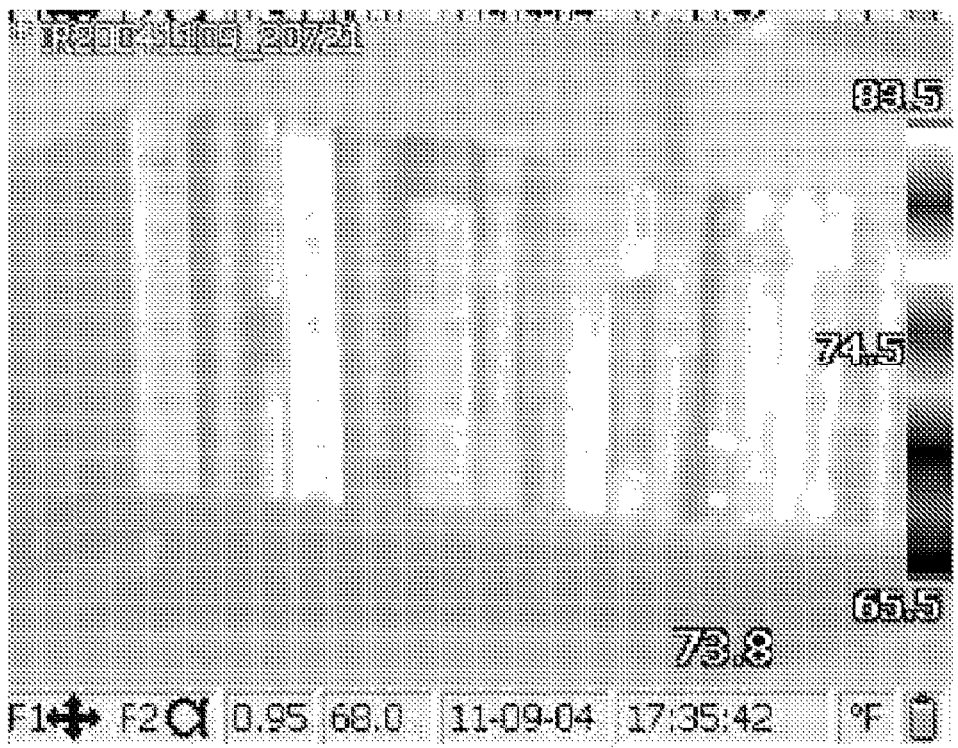
FIG. 19 shows the same scene with an alpha-blended visible-light image, yielding a much higher apparent contrast.

The advantages have already been stated above. The infrared image will not only be sharper with much more detail, it will be surrounded with a visual image showing exactly what and where the infrared targets are. Parallax error will be automatically corrected, yielding a visible-light control image that is correctly registered with the infrared image. Infrared cameras can be made with smaller less expensive detector arrays, yet display the apparent detail and contrast of very expensive infrared cameras with large and ultra-sensitive detector arrays. FIG. 18 shows a typical infrared image of a low infrared contrast scene. FIG. 19 shows the same scene with an alpha-blended visible-light image, yielding a much higher apparent contrast with target site temperature measurement.

Uses

This camera can be used in all phases of infrared thermography where current infrared cameras are used today and in the future. In the case of the simplest uses such as an electricians tool, the camera can be made inexpensively with a small infrared detector array and yet have very high performance—high image quality with high spatial resolution and accurate temperature. In the case of high-end thermography the camera can be made at a lower cost and have images with greater apparent detail than the most expensive infrared cameras. The camera will eliminate the need to take separate visible-light images to be included in thermography reports.

Laser Pointer

Various applications are possible using the laser embodiments of the present invention. As previously mentioned, because the laser pointer radiation is in the visible spectrum, it is not visible in the infrared image. As a result, the laser pointer is of limited value in infrared cameras. This is problematic when the location of a hot or cold spot is difficult to identify. For example, large industrial control panels often have many components that are similar in shape and packed tightly together. It is sometimes difficult to determine the exact component that is causing a hot spot in the infrared camera image. In addition, in building inspection applications where a wall appears uniform in the visible image but shows a defect in the infrared image, the laser pointer of the embodiments of the invention can be used to identify the exact location of the defect on the wall. For roof leak detection applications, it can greatly aid the thermographer in marking the area suspected of needing repair. The camera operator can outline the wet area by adjusting the camera pointing so that the laser spot seen in the image outlines the suspected wet area in the image and thus also outlines the suspected wet area on the roof with the laser beam so that it can be correctly marked. In an R&D application where the target is complex such as a printed wiring board assembly, the laser pointer embodiments of the invention may aid in identifying the location of the infrared point of interest.

Figure 24:
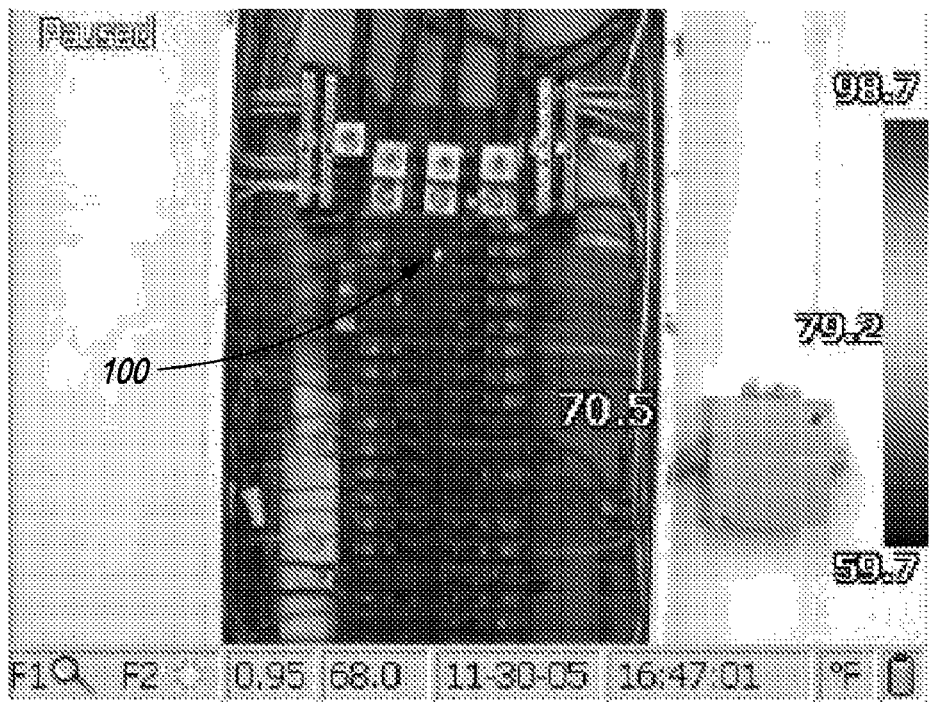
FIGS. 24-26 show, respectively, a visible-light only image with a laser point, an alpha-blended visible-light/infrared image with a laser point and hot spot not aligned, and an alpha-blended visible-light/infrared image with a laser point spot aligned.
Figure 25:
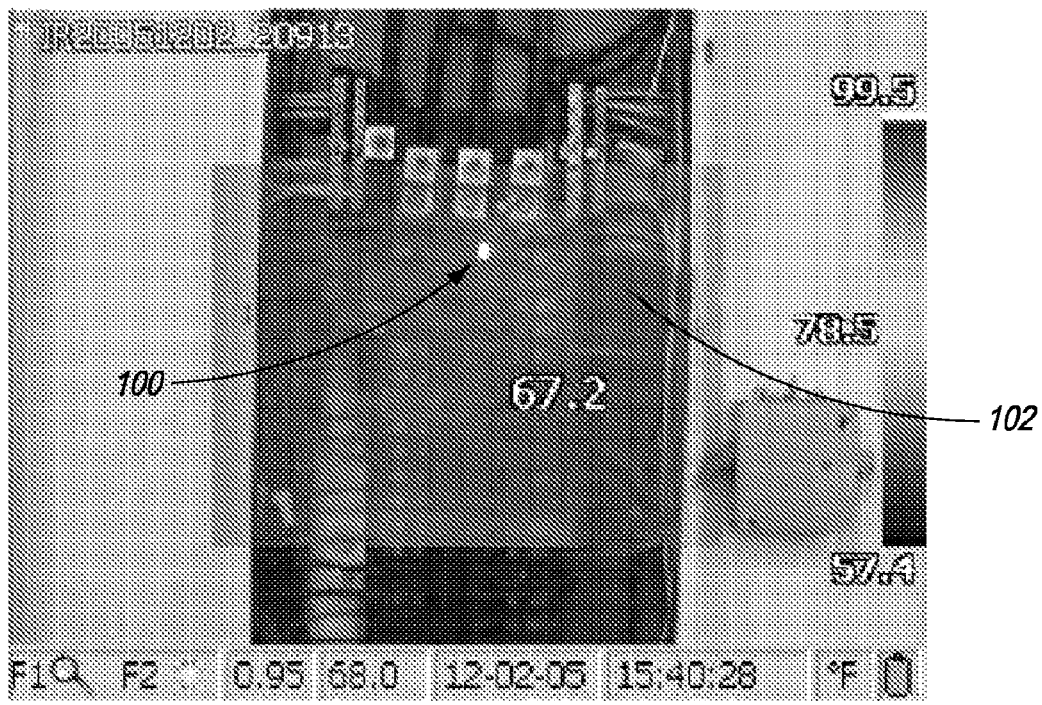
Figure 26:
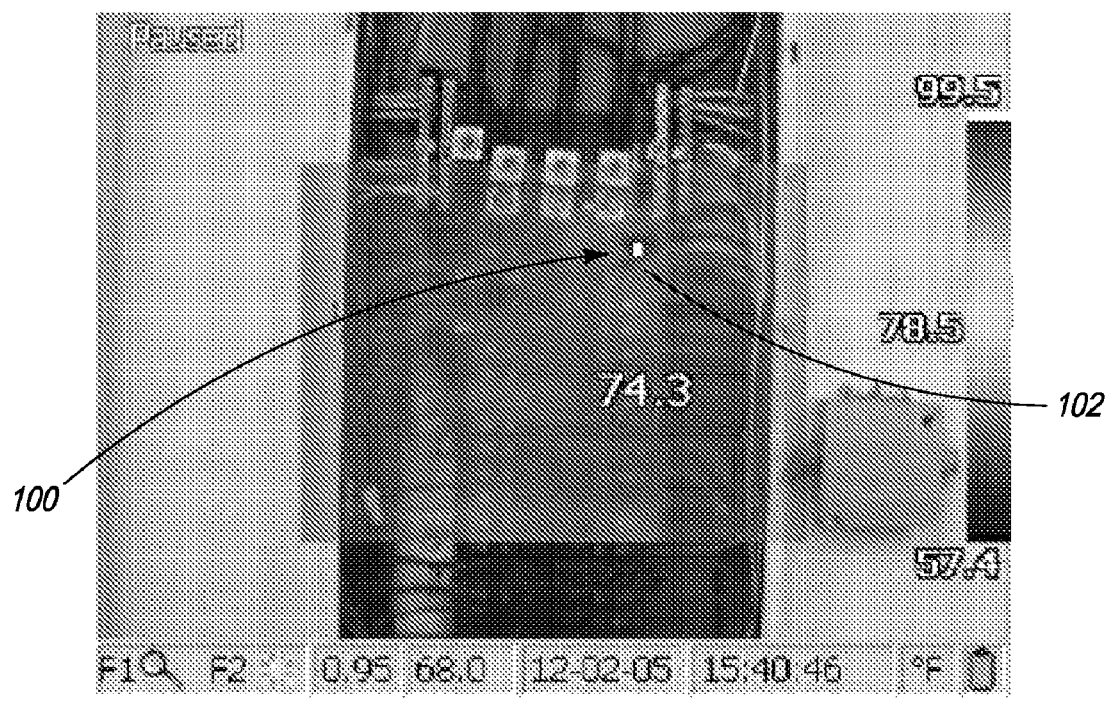

The laser pointer of the embodiments of the invention is used to accurately identify the location of infrared points-of-interest and to easily aid the focusing of the infrared optics. FIGS. 24-26 show an associated sequence of events. The laser pointer can be turned on using one of the camera's programmable buttons or by other mechanisms by the camera operator. At a reasonable distance, the laser pointer spot 100 on the target can be seen in the visible-light image (FIG. 24) and in the blended visible-light and infrared image that has been corrected for parallax error (FIG. 25). Once the laser spot is identified in the blended image (FIG. 25), the camera operator can adjust the camera pointing until the laser spot in the blended image matches the spot of interest 102 in the infrared image (FIG. 26). The laser beam then marks the target at the point-of-interest (FIG. 26).

Figure 27:
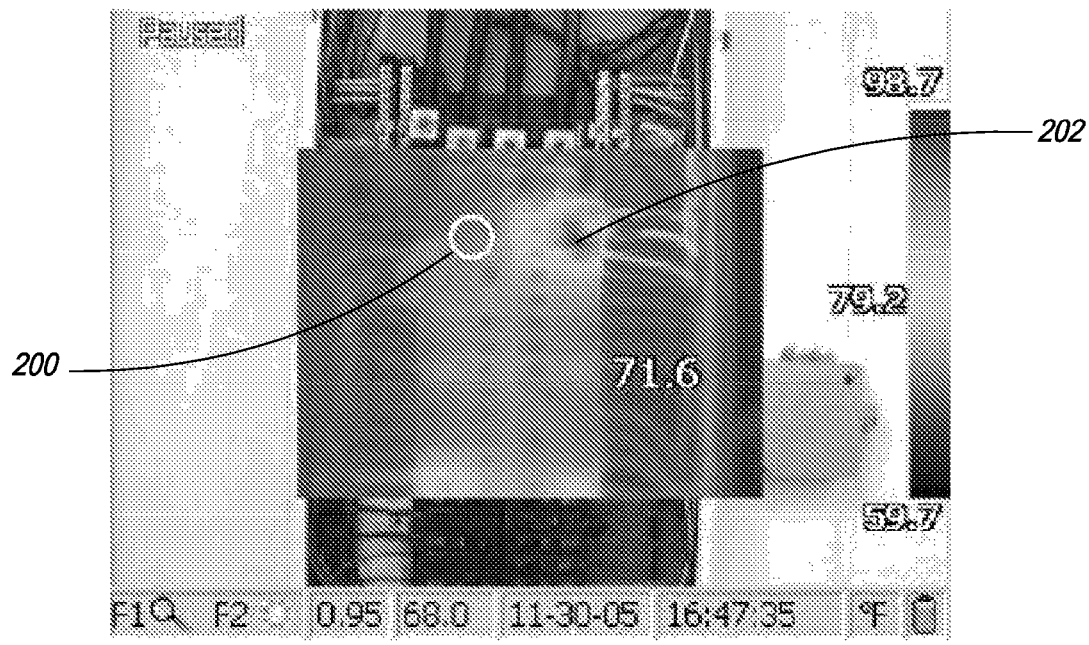
FIGS. 27-28 show, respectively, an infrared only image with a computer generated laser pointer and hot spot not aligned and an infrared only image with the computer generated laser pointer and hot spot aligned.
Figure 28:
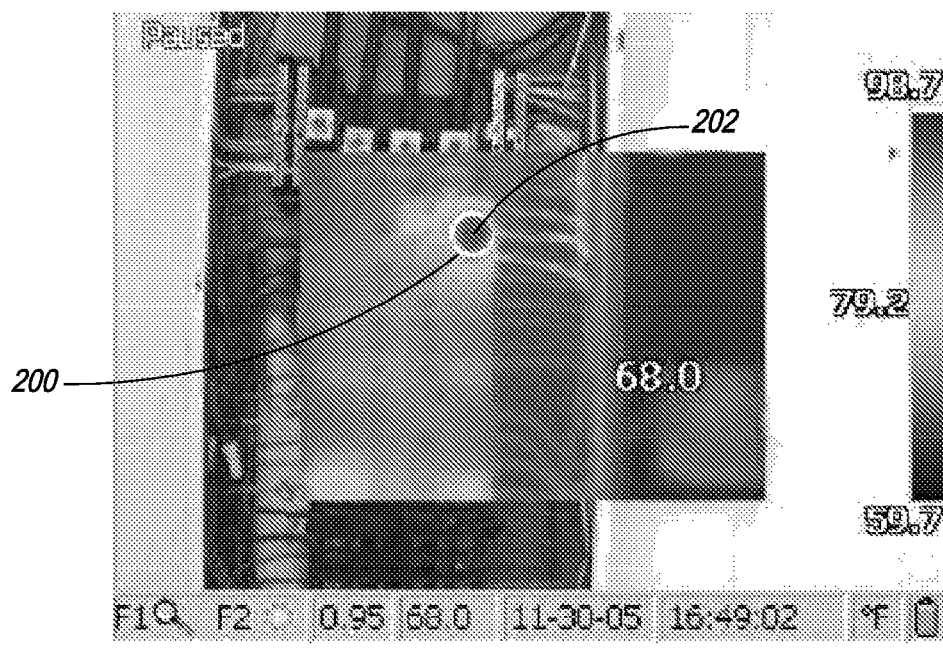

Because the camera according to the embodiments of the invention has been calibrated in the factory to identify the location of the laser spot in the infrared image using parallax calibration data as a function of infrared camera module focus distance, the camera operator does not need to see displayed the laser spot in the VL image. If the target is at a distance and/or has a low reflection for the laser wavelength, the laser spot may be too weak for the VL camera to show prominently on the camera display but it can still be seen on the target by the human observer. FIGS. 27 and 28 show an associated sequence of events. In this case, the infrared focus is adjusted as normally done by observing the sharpness of the infrared image. A computer-generated laser spot reference mark 200 is registered with the infrared image so that a representative mark (e.g., circle) is displayed on the infrared image (FIG. 27). The camera operator then adjusts the camera pointing until the laser calibration mark 200 lies over the infrared point-of-interest 202 (FIG. 28). Once that happens, the laser beam then strikes the target at the point of interest.

Figure 20:
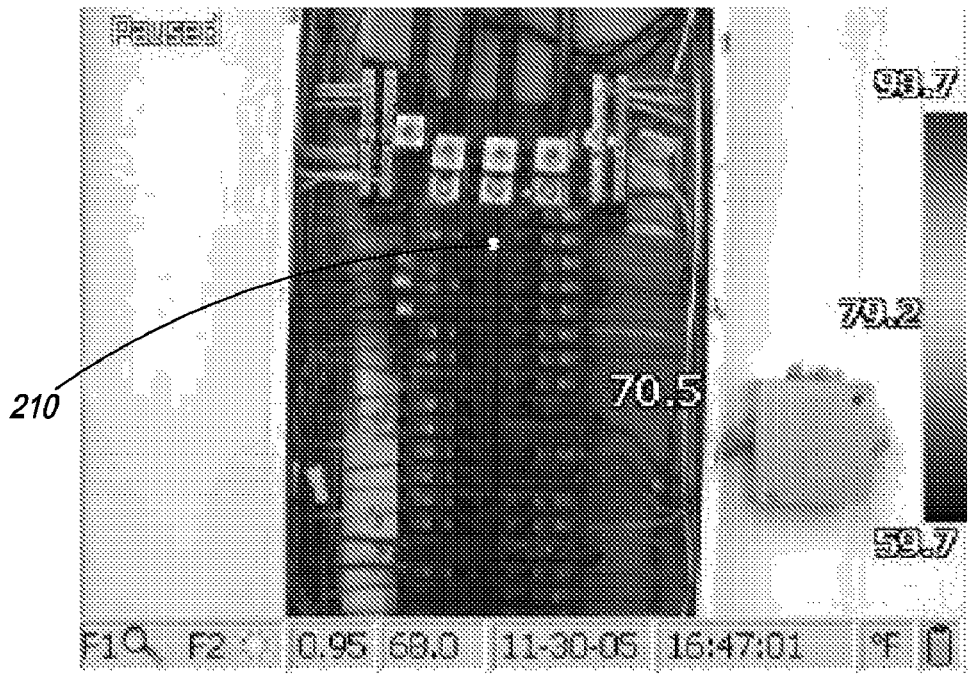
FIGS. 20-23 show, respectively, a visible-light image with a laser spot, a visible-light image with the laser spot and a computer generated laser marker aligned with the laser spot, an infrared only image with the computer generated laser marker and hot spot not aligned, and an infrared only image with the computer generated laser marker and hot spot aligned.
Figure 21:
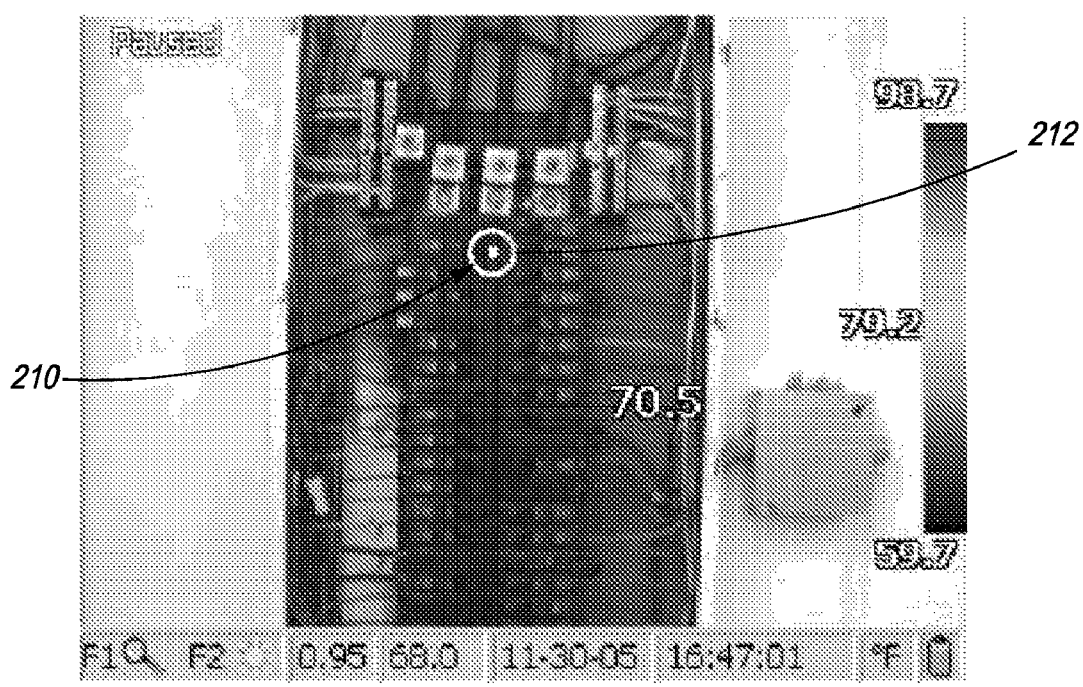
Figure 22:
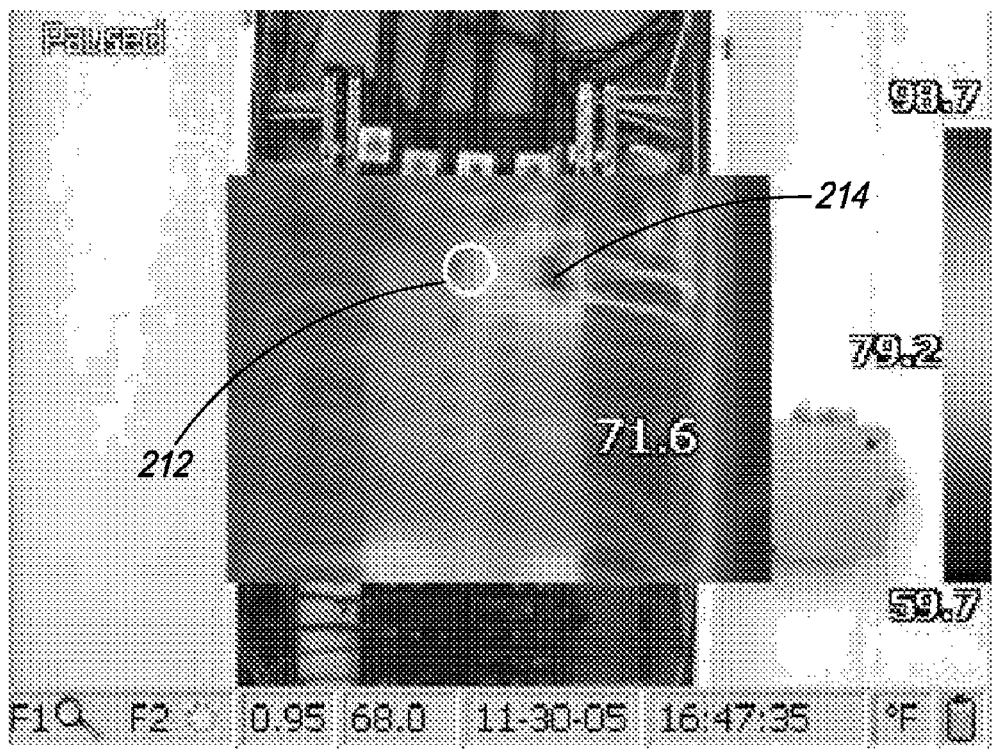
Figure 23:
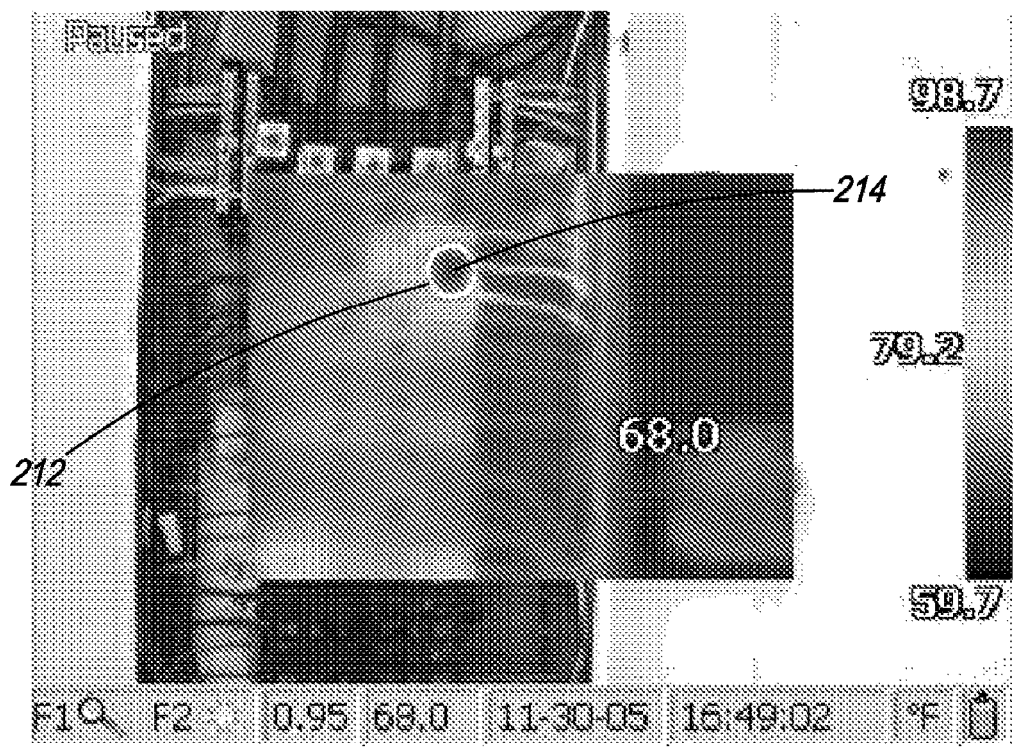

Alternatively, the camera operator first focuses the infrared image using an infrared display image only, switches to the visible-light display where the laser 210 will be shown in the display as seen in FIG. 20. The operator marks the laser spot 210 on the display with a marking 212 such as a circle (see FIG. 21) and then switches the display back to the infrared only (see FIG. 22) where the marking 212 is registered with the infrared image and it is displayed on the infrared image, positioned in the center quarter of the display area. The operator then adjusts the camera pointing so that the mark 212 on the infrared display matches the thermal spot of interest 214 on the infrared display. (see FIG. 23) Once that happens, the laser beam then strikes the target at the point of interest.

Using the Laser Pointer to Focus the Infrared Image

Figure 29:
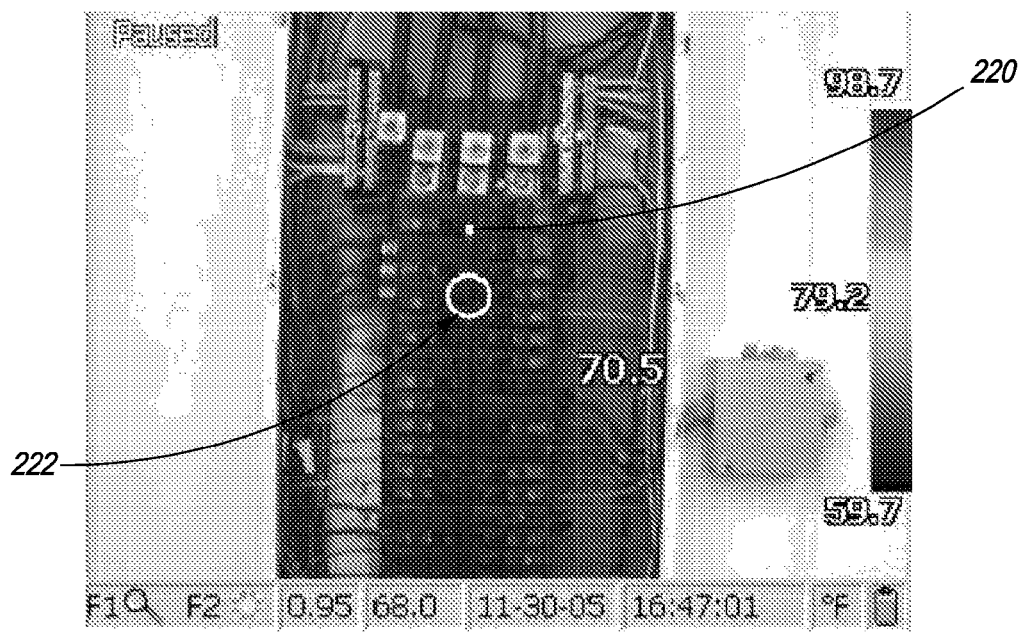
FIGS. 29-30 show, respectively, a visible-light only image with a laser spot and a computer generated laser marker not aligned and a visible-light only image with the laser spot and computer generated laser marker aligned.
Figure 30:
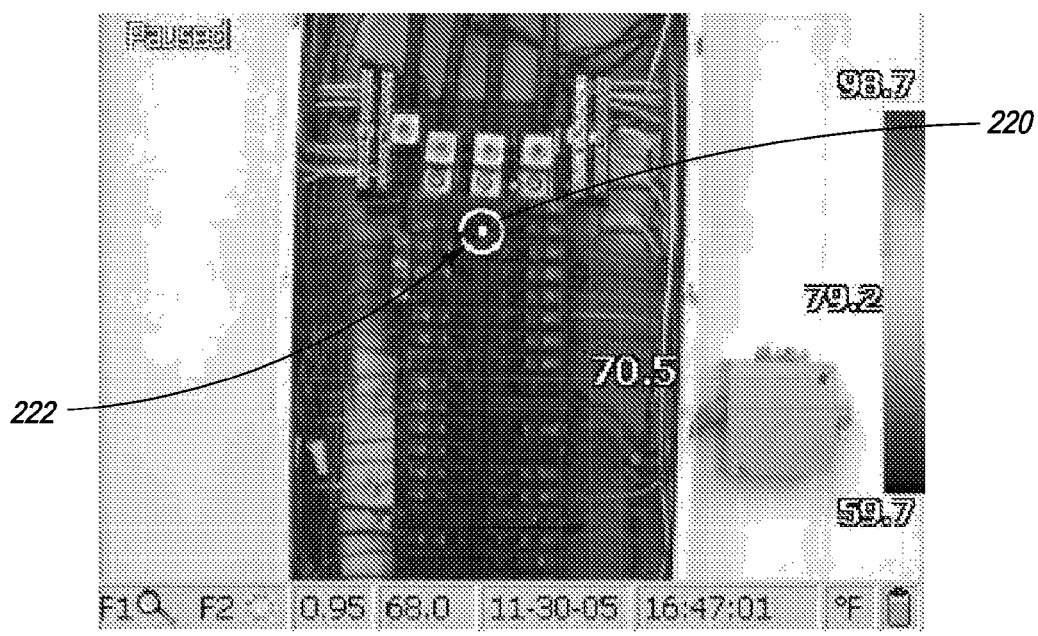

With calibration data correcting for parallax between the laser pointer and the infrared image and the ability to see the actual laser spot in the VL image, a process for monitoring and aiding the infrared focus is possible. FIGS. 29 and 30 show an associated sequence of events. In this case, the location of the laser spot 220 is visible in the VL image (FIG. 29). The camera according to the embodiments of the invention has been calibrated in the factory to generate a computer-generated laser spot reference mark 222 that indicates the location of the laser spot in a focused infrared image using parallax calibration data as a function of infrared camera module focus distance. This reference mark may be displayed in the IR image or the VL image (that overlaps the IR image). In FIG. 29, the reference mark 222 is shown in the VL only image. As the infrared lens is adjusted, the mark moves in the VL image showing the spot where the laser dot would be in the infrared image. When the infrared mark is coincident with the laser dot seen in the VL image (FIG. 30), the focus adjustment may stop and the infrared camera module is in focus. This allows the most novice operator to focus the infrared lens and eliminates the subjective nature of focusing.

What is claimed is:

1. A camera for producing visible-light (VL) images and infrared (IR) images, comprising:
    an array of VL sensors for sensing VL images of a target scene;
    an array of IR sensors for sensing IR images of the target scene; and
    a display for concurrently displaying portions of the sensed IR images and the sensed VL images of the target scene registered to form a composite image, the display displaying only the portions of the sensed IR images meeting at least one alarm criterion, the portions of the sensed IR images meeting the at least one alarm criterion are flashed on and off the display.

2. The camera of claim 1, wherein the at least one alarm criterion is user-definable.

3. The camera of claim 1, wherein the sensed VL images are displayed in gray scale.

4. The camera of claim 3, wherein the sensed IR images are displayed in color.

5. The camera of claim 1, wherein the sensed IR images and VL images are alpha-blended to form the composite image.

6. The camera of claim 1, wherein the sensed IR images meeting the at least one alarm criterion are displayed in place of corresponding sensed VL image portions of the target scene.

7. The camera of claim 1, wherein the display displays only the portions of the sensed VL images of the target scene not meeting the at least one alarm criterion.

8. The camera of claim 1, wherein the at least one alarm criterion includes a hot threshold, whereby the portions of the sensed IR images exceeding the hot threshold will be displayed.

9. The camera of claim 8, wherein the at least one alarm criterion is the only alarm criterion and is a hot threshold, whereby only the sensed IR images exceeding the hot threshold will be displayed.

10. The camera of claim 1, wherein the at least one alarm criterion includes a cold threshold temperature, whereby the portions of the sensed IR images below the cold threshold temperature will be displayed.

11. The camera of claim 1, wherein the at least one alarm criterion includes an absolute temperature range defined as a specific range of temperatures, whereby the portions of the sensed IR images within the absolute temperature range are displayed.

12. The camera of claim 11, wherein the absolute temperature range is user-definable.

13. The camera of claim 1, wherein the portions of the sensed IR images meeting the at least one alarm criterion are flashed on the display between a display of only corresponding sensed VL image portions of the target scene and only the portions of the sensed IR images meeting the at least one criterion.

14. The camera of claim 1, wherein portions of the sensed IR images meeting the at least one alarm criterion are flashed on the display between a display of only corresponding sensed VL image portions of the target scene and blended sensed IR images and VL images.

15. The camera of claim 1, further including an alarm module for providing an audible or vibrational alarm when a portion of the sensed IR images meets the at least one alarm criterion.

16. A hand-held camera for producing infrared (IR) images, comprising:
an IR camera module supported by a camera housing and having IR sensors and IR optics, the IR sensors including an array of IR sensors for sensing IR images of a target scene; and
a display supported by the camera housing for displaying portions of the sensed IR images of the target scene, the display displaying only the portions of the sensed IR images meeting at least one user-defined alarm criterion, the at least one user-defined alarm criterion including a relative threshold defined as a range of temperatures within a pre-defined number of degrees of a reference temperature, whereby the portions of the sensed IR images within the range are displayed.

17. The camera of claim 16, further comprising an alarm module for providing an audible or vibrational alarm when a portion of the sensed IR images meets the at least one user-defined alarm criterion.

18. The camera of claim 17, further including an array of visible light (VL) sensors for sensing VL images of the target scene.

19. The camera of claim 18, wherein the display concurrently displays portions of the sensed IR images and the sensed VL images of the target scene.

20. The camera of claim 17, further including a graphical user interface for setting the at least one user-defined alarm criterion.

21. The camera of claim 16, wherein the relative threshold is one of a hot relative threshold and a cold relative threshold.

22. The camera of claim 16, further including a graphical user interface for setting the at least one user-defined alarm criterion.

23. The camera of claim 16, wherein the relative threshold is a hot relative threshold defined as temperatures greater than a user-defined amount below the reference temperature.

24. The camera of claim 16, wherein the reference temperature is one of the current hottest sensed IR image portion, the average of several current hottest sensed IR portions, the hottest sensed IR image portion in a previous target scene, and the hottest sensed IR image portion in a reference target scene.

25. The camera of claim 16, wherein the reference temperature is one of the current coldest sensed IR image portion, the average of the current coldest sensed IR portions, the coldest sensed IR image portion in a previous target scene, and the coldest sensed IR image portion in a reference target scene.

26. The camera of claim 16, further including an array of visible light (VL) sensors for sensing VL images of the target scene, the display concurrently displaying portions of the sensed VL images and the portions of the sensed IR images registered to form a composite image.

27. The camera of claim 26, wherein the display displays the sensed VL images of the target scene surrounding the portions of the sensed IR images meeting the at least one user-defined alarm criterion.

28. The camera of claim 26, wherein the portions of the sensed IR images meeting the at least one user-defined alarm criterion are displayed generally centrally on the display within the portions of the sensed VL images.

29. The camera of claim 26, wherein the portions of the sensed IR images meeting the at least one user-defined alarm criterion are displayed without corresponding sensed VL images of the target scene.

30. The camera of claim 16, wherein the range of temperatures are user-defined.

31. The camera of claim 16, wherein the range of temperatures is predetermined.

32. The camera of claim 16, wherein the reference temperature is calculated by the camera.

33. The camera of claim 16, wherein the reference temperature is calculated based on infrared pixels in the current infrared scene.

34. The camera of claim 16, wherein the reference temperature is calculated based on infrared pixels in a previous infrared scene.

35. The camera of claim 16, wherein the reference temperature is calculated based on infrared pixels in a reference infrared scene.

* * * * *